(12) United States Patent
You et al.

(10) Patent No.: US 11,631,447 B2
(45) Date of Patent: Apr. 18, 2023

(54) MEMORY CIRCUIT AND MANUFACTURING METHOD THEREOF

(71) Applicants: TAIWAN SEMICONDUCTOR MANUFACTURING CO., LTD., Hsinchu (TW); NATIONAL YANG MING CHIAO TUNG UNIVERSITY, Hsinchu (TW)

(72) Inventors: Wei-Xiang You, Kaohsiung (TW); Pin Su, Hsinchu County (TW); Kai-Shin Li, Hsinchu County (TW); Chenming Hu, Oakland, CA (US)

(73) Assignees: TAIWAN SEMICONDUCTOR MANUFACTURING CO., LTD., Hsinchu (TW); NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 16/522,451

(22) Filed: Jul. 25, 2019

(65) Prior Publication Data
US 2021/0028178 A1    Jan. 28, 2021

(51) Int. Cl.
*G11C 11/405* (2006.01)
*G11C 11/22* (2006.01)
(Continued)

(52) U.S. Cl.
CPC ......... *G11C 11/405* (2013.01); *G11C 11/223* (2013.01); *G11C 11/2273* (2013.01); *G11C 11/2275* (2013.01); *G11C 11/24* (2013.01); *G11C 11/41* (2013.01); *H01L 21/823821* (2013.01); *H01L 21/823871* (2013.01); *H01L 23/5286* (2013.01); *H01L 27/0924* (2013.01); *H01L 29/6681* (2013.01); *H01L 29/6684* (2013.01); *H01L 29/7851* (2013.01); *H01L 29/78391* (2014.09)

(58) Field of Classification Search
CPC ..... G11C 11/405; G11C 11/223; G11C 11/24; H01L 29/78391; H01L 21/823821
USPC .......................................................... 365/145
See application file for complete search history.

(56) References Cited

U.S. PATENT DOCUMENTS 5,986,958 A * 11/1999 Voogel .................. G11C 11/406
365/222
6,498,742 B2 * 12/2002 Chu .................. H01L 29/78391
257/E29.272
(Continued)

OTHER PUBLICATIONS

Kai-Shin Li et al., "Negative-Capacitance FinFET Inverter, Ring Oscillator, SRAM Cell, and Ft", International Electron Devices Meeting (IEDM), IEDM18-731~IEDM1 8-734, 2018 IEEE, Dec. 1, 2018.
(Continued)

*Primary Examiner* — Anthan Tran
(74) *Attorney, Agent, or Firm* — Maschoff Brennan

(57) ABSTRACT

A memory circuit includes a memory cell and a source line transistor. The memory cell includes a first transistor, a second transistor, a third transistor, and a fourth transistor. The second transistor and the third transistor form an inverter electrically connected to a drain of the first transistor. The inverter is configured to store two states with different applied voltages. The fourth transistor is electrically connected to a node of the inverter. The source line transistor is electrically connected to the fourth transistor.

20 Claims, 26 Drawing Sheets

(51) Int. Cl.
*G11C 11/41* (2006.01)
*H01L 27/092* (2006.01)
*H01L 23/528* (2006.01)
*H01L 29/78* (2006.01)
*H01L 21/8238* (2006.01)
*H01L 29/66* (2006.01)
*G11C 11/24* (2006.01)

(56) References Cited

U.S. PATENT DOCUMENTS

| | | | | |
|---|---|---|---|---|
| 8,289,755 | B1* | 10/2012 | Rahim | G11C 11/4125 365/189.08 |
| 2003/0095448 | A1* | 5/2003 | Ichige | G11C 16/0483 257/E27.103 |
| 2005/0213415 | A1* | 9/2005 | Matsuzawa | G11C 8/08 365/189.11 |
| 2012/0230130 | A1* | 9/2012 | Sheppard | G11C 11/418 365/189.011 |
| 2013/0314977 | A1* | 11/2013 | Wang | G11C 11/412 365/156 |
| 2016/0225795 | A1* | 8/2016 | Koezuka | H01L 29/78648 |
| 2016/0260721 | A1* | 9/2016 | Bowen | H01L 27/1116 |
| 2019/0088760 | A1* | 3/2019 | Lee | H01L 29/7839 |

OTHER PUBLICATIONS

Wei-Xiang You et al., "Evaluation of NC-FinFET Based Subsystem-Level Logic Circuits", IEEE Transactions on Electron Devices, vol. 66, No. 4, Apr. 2019, pp. 2004-2009.

I. Lundström et al., "Carrier trapping hysteresis in MOS transistors", Physica status solidi (a), vol. 1, 1970, pp. 395-407.

S Maikap et al., "Charge trapping characteristics of atomic-layer-deposited HfO2 films with Al2O3 as a blocking oxide for high-density non-volatile memory device applications", Semiconductor Science and Technology, vol. 22, 2007, pp. 884-889.

* cited by examiner

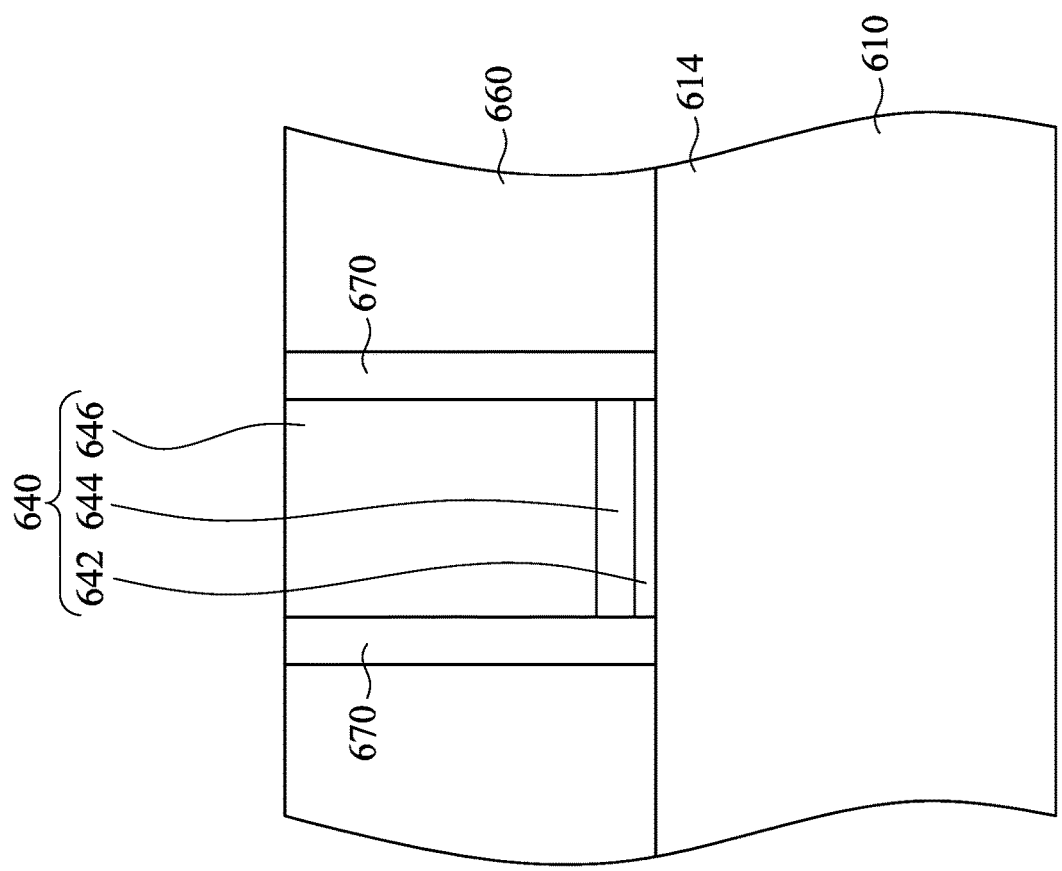

MEMORY CIRCUIT AND MANUFACTURING METHOD THEREOF

BACKGROUND

Generally, memory refers to the physical devices used to store data or programs (sequences of instructions) on a temporary or permanent basis for use in an electronic digital computing device. Computing devices represent information in binary code, written as sequences of 0s and 1s. Each binary digit (or "bit") may be stored by any physical system that can be in either of two stable states, to represent 0 and 1. This could be an on-off switch, an electrical capacitor that can store or lose a charge, a magnet with its polarity up or down, or a surface that can have a pit or not. Today, capacitors and transistors, functioning as tiny electrical switches, are used for temporary storage, and either disks or tape with a magnetic coating, or plastic discs with patterns of pits are used for long-term storage. Primary computing memory makes use of integrated circuits consisting of silicon-based transistors. There are two main types of memory: volatile and non-volatile.

Volatile memory is a kind of computing memory that uses power to maintain the stored information. Most modern semiconductor volatile memory is either Static Random Access Memory (SRAM) or dynamic Random Access Memory (DRAM). SRAM retains its contents as long as the power is connected. SRAM is commonplace in small embedded systems, and it is used in many other systems too. A typical SRAM uses six transistors (6T) to store each memory bit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20 is a cross-sectional view along line B-B in FIG. 19.

DETAILED DESCRIPTION

Figure 1:
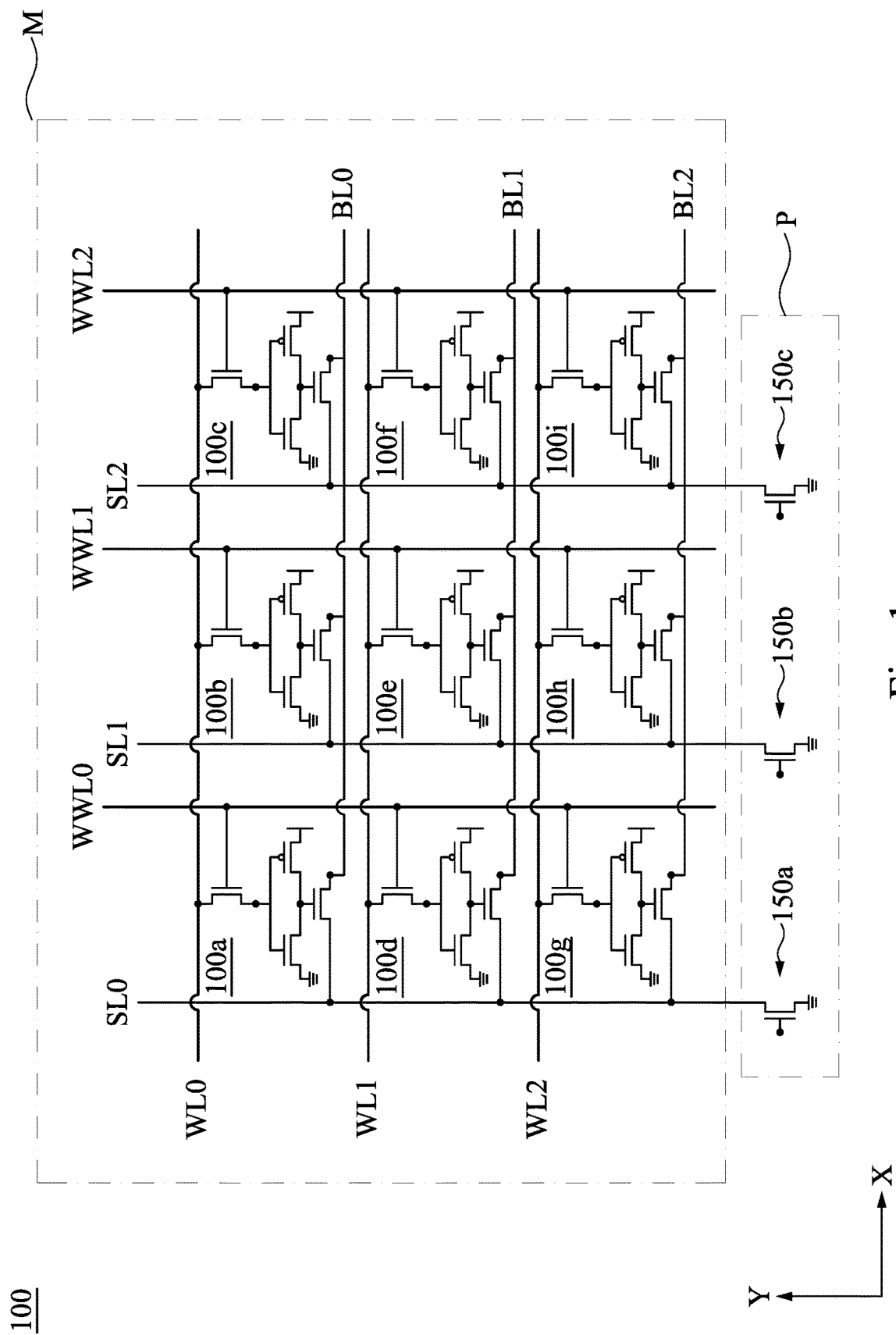
FIG. 1 is a schematic drawing illustrating an exemplary memory circuit according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The embodiments of the present disclosure provide a four transistor (4T) memory circuit having a single inverter to implement a memory device with two storage states. In some embodiments, the transistors may be realized on the device selected from the group consisting of planar devices, multi-gate devices, FinFETs, nanosheet-gate FETs, and gate-all-around FETs.

FIG. 1 is a schematic drawing illustrating an exemplary memory circuit 100 according to some embodiments of the present disclosure. In FIG. 1, the memory circuit 100 includes a plurality of memory cells 100a, 100b, 100c, 100d, 100e, 100f, 100g, 100h, and 100i, each of which includes four transistors, for storing data. Each of the memory cells 100a-100i may be coupled with one of word lines WL0, WL1, and WL2, one of bit lines BL0, BL1, and BL2, one of write word lines WWL0, WWL1, and WWL2, and one of source lines SL0, SL1, and SL2. For example, the memory cell 100a may be coupled with the word line WL0, the bit line BL0, the write word line WWL0, and the source line SL0. The memory cell 100b may be coupled with the word line WL0, the bit line BL0, the write word line WWL1, and the source line SL1. The memory cell 100c may be coupled with the word line WL0, the bit line BL0, the write word line WWL2, and the source line SL2. The memory cell 100d may be coupled with the word line WL1, the bit line BL1, the write word line WWL0, and the source line SL0. The memory cell 100e may be coupled with the word line WL1, the bit line BL1, the write word line WWL1, and the source line SL1. The memory cell 100f may be coupled with the word line WL1, the bit line BL1, the write word line WWL2, and the source line SL2. The memory cell 100g may be coupled with the word line WL2, the bit line BL2, the write word line WWL0, and the source line SL0. The memory cell 100h may be coupled with the word line WL2, the bit line BL2, the write word line WWL1, and the source line SL1. The memory cell 100i may be coupled with the word line WL2, the bit line BL2, the write word line WWL2, and the source line SL2. It is noted that though merely some memory cells 100a-100i are depicted, other memory cells (not shown) can be coupled with the plurality of lines (word lines, bit lines, write word lines, and/or source lines) of the memory circuit 100. A portion of the memory circuit 100 may have 8, 16, 32, 64, 128 or more columns that can be arranged in both X-axial and Y-axial directions.

In FIG. 1, the word lines WL0-WL2 and the bit lines BL0-BL2 may extend substantially in the same direction. For example, the word lines WL0-WL2 and the bit lines BL0-BL2 extend substantially in X-axial direction. Further, the write word lines WWL0-WWL2 and the source lines SL0-SL2 may extend substantially in the same direction. For example, the write word lines WWL0-WWL2 and the source lines SL0-SL2 extend substantially in Y-axial direction. Stated another way, the word lines WL0-WL2 (the bit lines BL0-BL2) and the write word lines WWL0-WWL2 (the source lines SL0-SL2) extend in different directions. For example, the word lines WL0-WL2 (the bit lines BL0-BL2) are substantially perpendicular to the write word lines WWL0-WWL2 (the source lines SL0-SL2).

Figure 2:
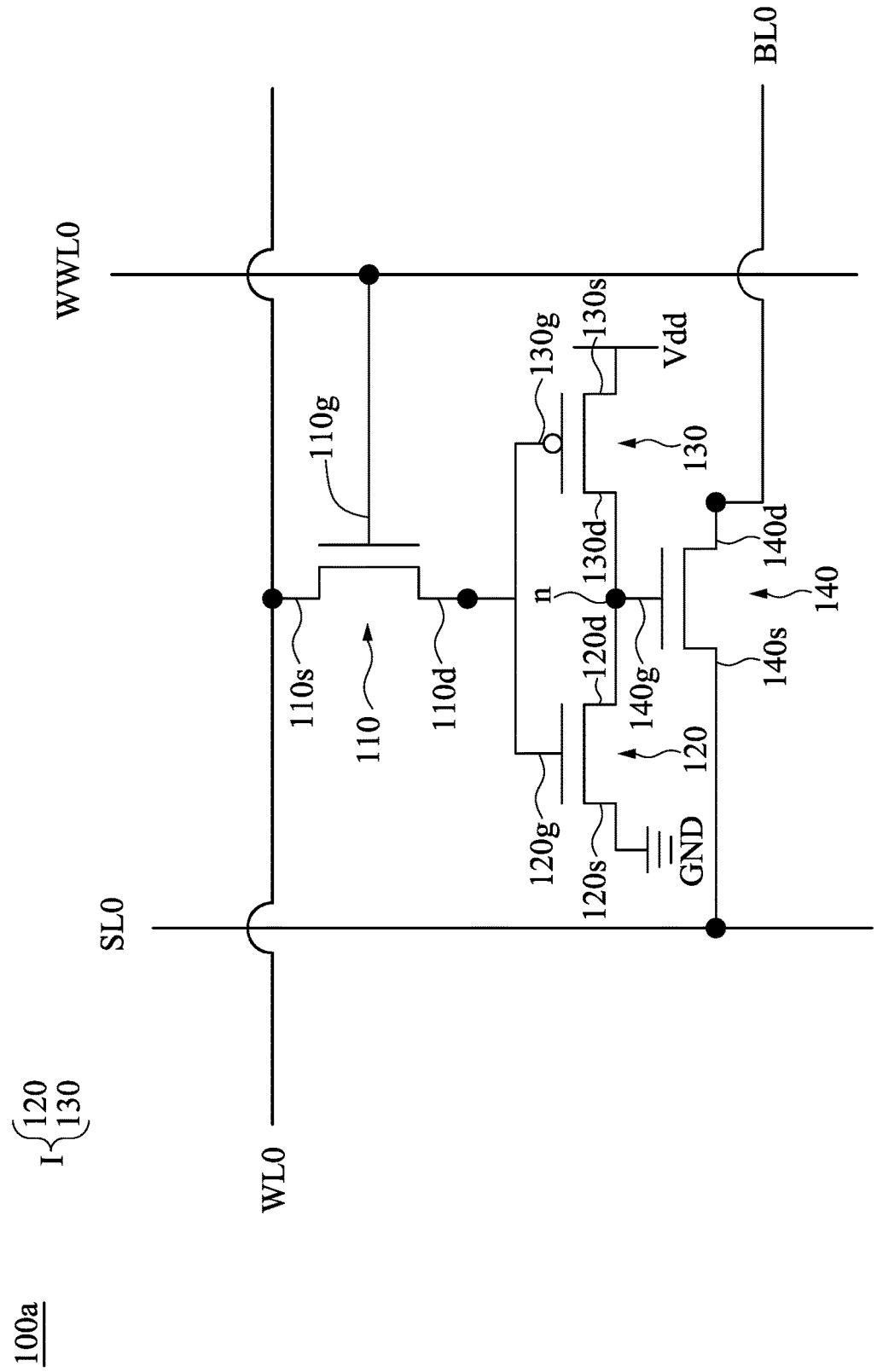
FIG. 2 is an enlarge view of the memory cell in FIG. 1.

FIG. 2 is an enlarge view of the memory cell 100a in FIG. 1. Reference is made to FIGS. 1 and 2. Each of the memory cells 100a-100i includes a first transistor 110, a second transistor 120, a third transistor 130, and a fourth transistor 140. The first transistor 110, the second transistor 120, and the fourth transistor 140 have the same conductivity type, and the third transistor 130 has a different conductivity type. For example, the first transistor 110, the second transistor 120, and the fourth transistor 140 are N-type transistors, and the third transistor 130 is a P-type transistor. Alternatively, the first transistor 110, the second transistor 120, and the fourth transistor 140 are P-type transistors, and the third transistor 130 is an N-type transistor. The second transistor 120 and the third transistor 130 form an inverter I of the memory cell, and the node n of the inverter I is connected to a gate 140g of the fourth transistor 140. In some embodiments, the first transistor 110, the second transistor 120, the third transistor 130, and the fourth transistor 140 are enhancement mode transistors.

A source 110s of the first transistor 110 is connected to one of the word lines (i.e., the word line WL0 in this memory cell 100a), a gate 110g of the first transistor 110 is connected to one of the write word lines (i.e., the write word line WWL0 in this memory cell 100a), and a drain 110d of the first transistor 110 is connected to a gate 120g of the second transistor 120 and a gate 130g of the third transistor 130. A source 120s of the second transistor 120 is connected to a ground (GND) line, and a drain 120d of the second transistor 120 is connected to a drain 130d of the third transistor 130. A source 130s of the third transistor 130 is connected to a power line Vdd'. The drain 120d and the drain 130d are further connected to a gate 140g of the fourth transistor 140. The source 140s of the fourth transistor 140 is connected to one of the source lines (i.e., the source line SL0 in this memory cell 100a), and a drain 140d of the fourth transistor 140 is connected to one of bit lines (i.e., the bit line BL0 in this memory cell 100a). Further, the fourth transistor 140 is electrically isolated from the write word line (i.e., the write word line WWL0 in this memory cell 100a). That is, the fourth transistor 140 and the write word line WWL0 are not electrically connected to each other.

Figure 3:
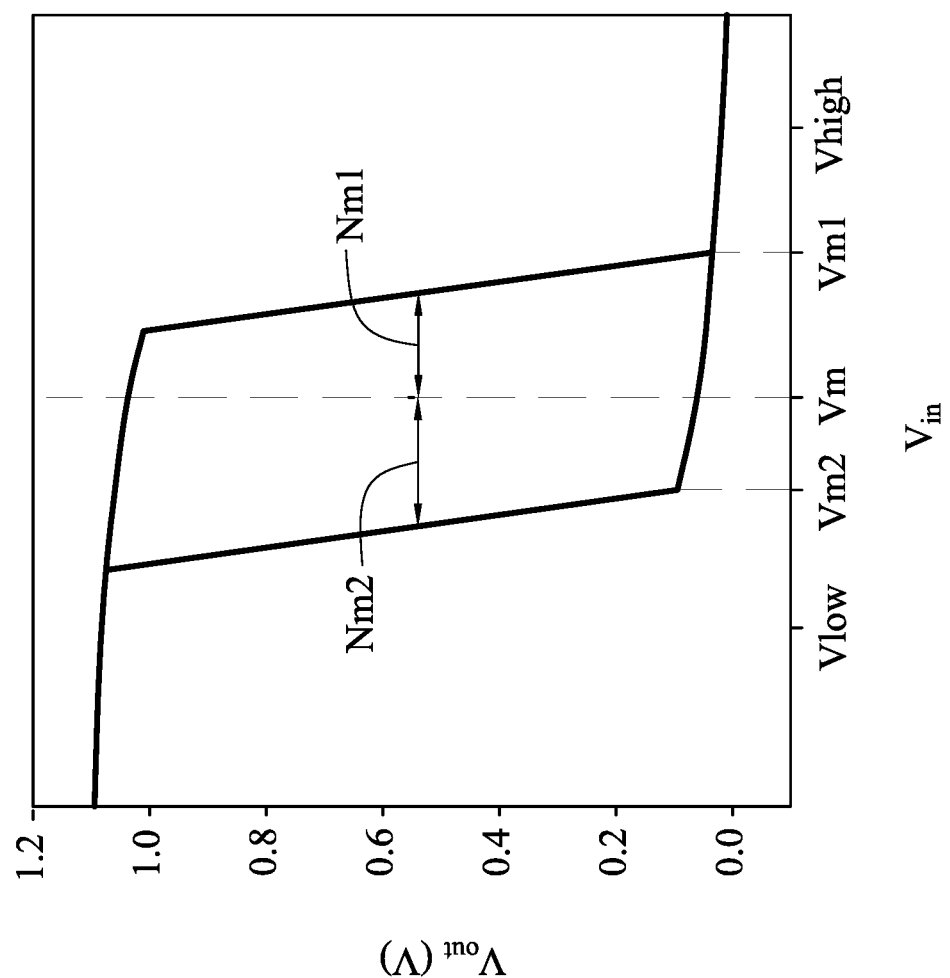
FIG. 3 shows a voltage transfer characteristic (VTC) hysteresis loop of an inverter in FIG. 2 according to some embodiments of the present disclosure.

In FIG. 2, the inverter I (i.e., the second transistor 120 and the third transistor 130) has a voltage transfer characteristic (VTC) hysteresis behavior, as shown in FIG. 3. In some embodiments, a middle voltage Vm has a substantially largest noise margin Nm (=min[Nm1, Nm2]). In some embodiments, the voltage transfer characteristic behaves as a clockwise hysteresis loop, and in some other embodiments, the voltage transfer characteristic behaves as a counter-clockwise hysteresis loop. In some embodiments, the second transistor 120 and the third transistor 130 may both be ferroelectric filed effect transistor (FeFET), or both be negative capacitance FET (NCFET), such that the resulting inverter has the VTC hysteresis behavior. With such configuration, the inverter can store two states with different applied voltages, as described in greater detail below. In some other embodiments, the first transistor 110 and the fourth transistor 140 may be FeFET, NCFET, MOS FET, or other suitable transistors.

Reference is made to FIG. 1. In some embodiments, the memory cells 100a-100i are disposed in a memory area M of the memory circuit 100, and the memory circuit 100 may further include a peripheral area P adjacent the memory area M. The source lines SL0-SL2 extend to the peripheral area P, and the memory circuit 100 may further include a plurality of source line transistors 150a, 150b, and 150c disposed on the peripheral area P. In some embodiments, the sources of the source line transistors 150a-150c may be grounded. The source lines SL0-SL2 are respectively connected to the source line transistors 150a-150c, such that the source line transistors 150a-150c can respectively charge the source lines SL0-SL2. In some embodiments, the source line transistors 150a-150c are enhancement mode transistors and has the same conductivity type as the first transistor 110 (the second transistor 120, and/or the fourth transistor 140). That is, the source line transistors 150a-150c are n-type transistor if the first transistor 110 (the second transistor 120, and/or the fourth transistor 140) is an n-type transistor, and vise versa. In some embodiments, the source line transistors 150a-150c may be MOSFET. In some other embodiments, however, the source line transistors 150a-150c may be FeFET or NCFET for improving the reading access time of the memory circuit 100.

Figure 4:
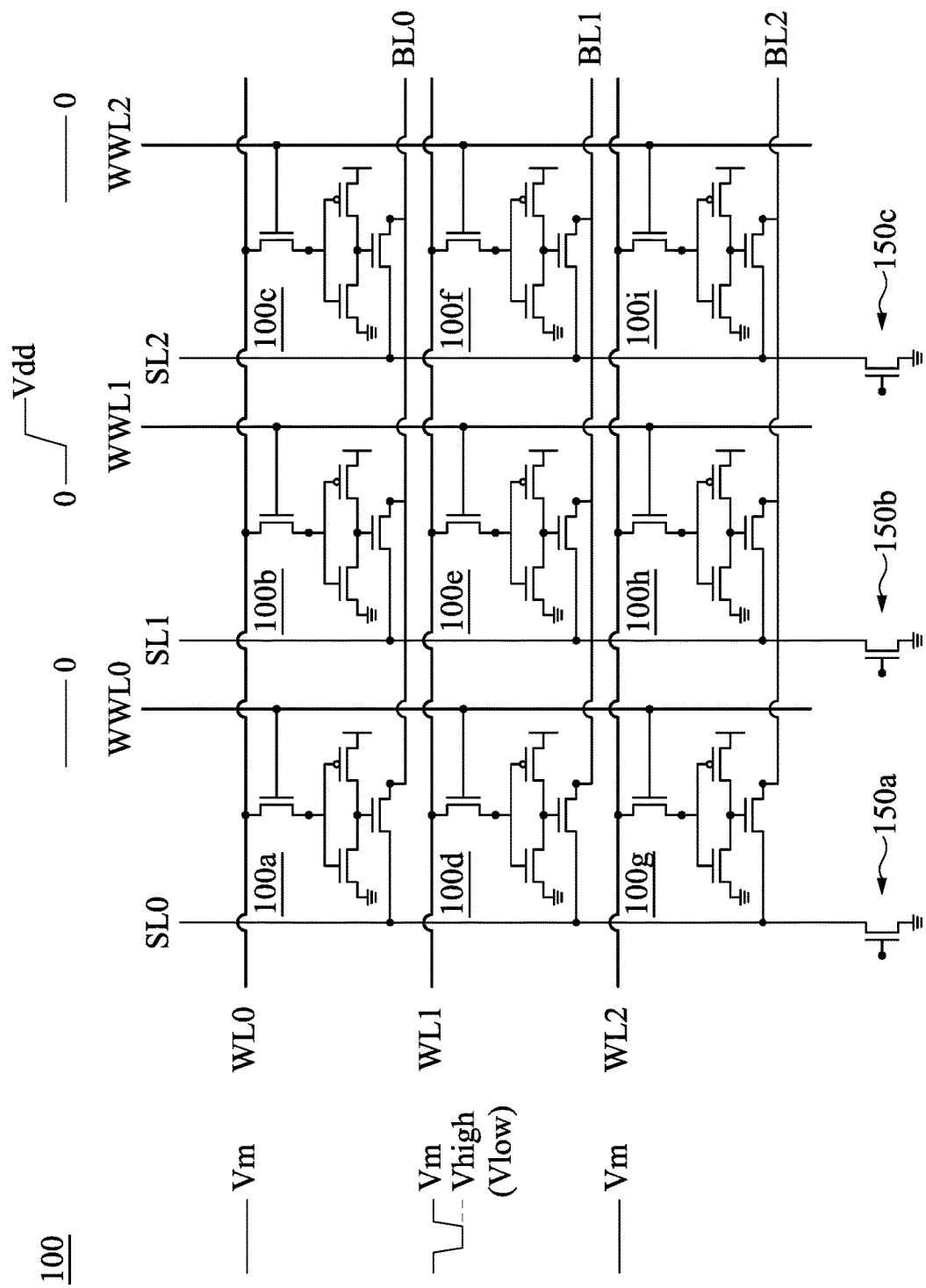
FIG. 4 is a schematic drawing illustrating an exemplary memory circuit at a writing operation according to some embodiments of the present disclosure.

FIG. 4 is a schematic drawing illustrating an exemplary memory circuit 100 at a writing operation according to some embodiments of the present disclosure. Reference is made to FIGS. 3 and 4. In greater detail, each of the memory cells 100a-100i has three different states it can be in: standby where the cell is idle, reading when the data has been requested and writing when updating the contents. The memory cell (here use the memory cell 100e as an example) performs the three different states (standby, read, write) as follows:

Writing—The start of a write cycle of the memory cell 100e begins by applying the value to be written to the word line WL1 and the write word line WWL1. For an inverter I having a clockwise VTC hysteresis loop, if a 0 is desired to be stored, a pulse voltage Vhigh higher than the voltage Vm1 is applied to the word line WL1, i.e. setting the word line WL1 to the pulse voltage Vhigh and the write word line WWL1 to Vdd. For an inverter I having a counter-clockwise VTC hysteresis loop, if a 0 is desired to be stored, a pulse voltage Vlow lower than the voltage Vm1 is applied to the word line WL1, i.e. setting the word line WL1 to the pulse voltage Vlow and the write word line WWL1 to Vdd. The first transistor 110 is thus turned on (by the write word line WWL1), and the current passes through the first transistor 110 to the gates of the second transistor 120 and the third transistor 130. As shown in FIG. 3, the output voltage Vout of the inverter I is substantially 0 when the voltage is applied to the gates. Therefore, the state "0" is stored in the node n of the inverter I (i.e., the drains of the second transistor 120 and the third transistor 130). During the writing operation of the memory cell 100e, the word lines WL0 and WL2 are charged to have the voltage Vm, and the write word lines WWL0 and WWL2 are charged to 0. Further, the bit lines BL0-BL2, and the source lines SL0-SL2 are floating.

On the other hand, for an inverter I has a clockwise VTC hysteresis loop, if a 1 is desired to be stored, a pulse voltage Vlow lower than the voltage Vm1 is applied to the word line WL1, i.e. setting the word line WL1 to the pulse voltage Vlow and the write word line WWL1 to Vdd. For an inverter I has a counter-clockwise VTC hysteresis loop, if a 1 is desired to be stored, a pulse voltage Vhigh higher than the voltage Vm2 is applied to the word line WL1, i.e. setting the word line WL1 to the pulse voltage Vhigh and the write word line WWL1 to Vdd. The first transistor 110 is thus turned on, and the current passes through the first transistor 110 to the gates of the second transistor 120 and the third transistor 130. As shown in FIG. 3, the output voltage Vout of the inverter I is substantially 1 when the voltage is applied to the gates. Therefore, the state "1" is stored in the node n of the inverter I. During the writing operation of the memory cell 100e, the word lines WL0 and WL2 are charged to have the voltage Vm, and the write word lines WWL0 and WWL2 are charged to 0. Further, the bit lines BL0-BL2 and the source lines SL0-SL2 are floating.

Such a configuration has a good write disturb free characteristic. In greater detail, for the memory cell 100b (100h), the word line WL0 (WL2) is charged to Vm, and the write word line WWL1 is charged to Vdd. While the first transistor 110 of the memory cell 100b (100h) is turned on, i.e., the current passes through the first transistor 110, the node n of the inverter I is still at the initial state because the voltage Vm is applied to the inverter I. As shown in FIG. 3, when the voltage Vm is applied to the inverter, the output voltage substantially maintains at its initial value. In some embodiments, the voltage variation (before writing and during writing) at the node n of the inverter I of the memory cell 100b (100h) is less than about 1e-1V, e.g., about 1.1e-2V, which is much less than the voltage difference between "0" and "1" states (about 1V). Therefore, the memory cells 100b and 100h can be considered as writing disturb free, i.e., the memory cells 100b and 100h are at standby (or idle) state.

Moreover, for the memory cell 100d (100f), the word line WL1 is charged to Vhigh (or Vlow), and the write word line WWL0 (WWL2) is charged to 0. Therefore, the first transistor 110 of the memory cell 100d (100f) is turned off, i.e., the current does not pass through the first transistor 110. Hence, the node n of the inverter I is still at its initial state. In some embodiments, the voltage variation (before writing and during writing) at the node n of the inverter I of the memory cell 100d (100f) is less than about 1e-5V, e.g., about 5.7e-6V, which is much less than the voltage difference between "0" and "1" states (about 1V). Therefore, the memory cells 100d and 100f can be considered as writing disturb free, i.e., the memory cells 100d and 100f are at standby (or idle) state.

Figure 22:
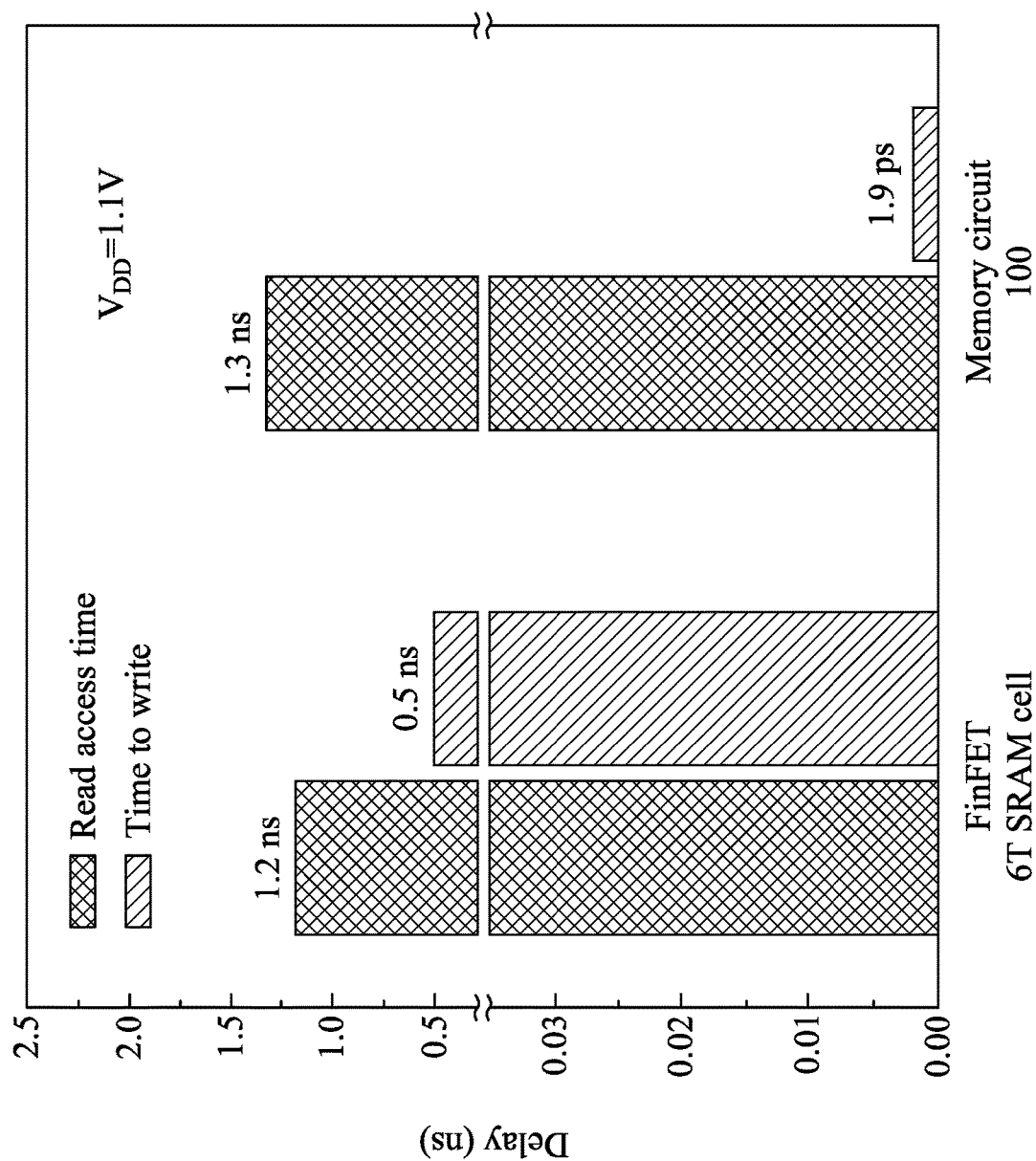
FIG. 22 is a performance comparison of the memory circuit of FIG. 1 and a 6T SRAM cell circuit.

Further, since the word lines of other memory cells (i.e., the memory cells 100a, 100c, 100g, and 100i) are set to be Vm, and the write word lines of other memory cells are set to be 0, the other memory cells (i.e., the memory cells 100a, 100c, 100g, and 100i in this case) have good write disturb free characteristic as well. In some embodiments, the writing time of the memory circuit 100 may be less than about 2 ps, e.g., about 1.9 ps (as shown in FIG. 22), which is much less than a typical SRAM cell circuit.

Figure 5:
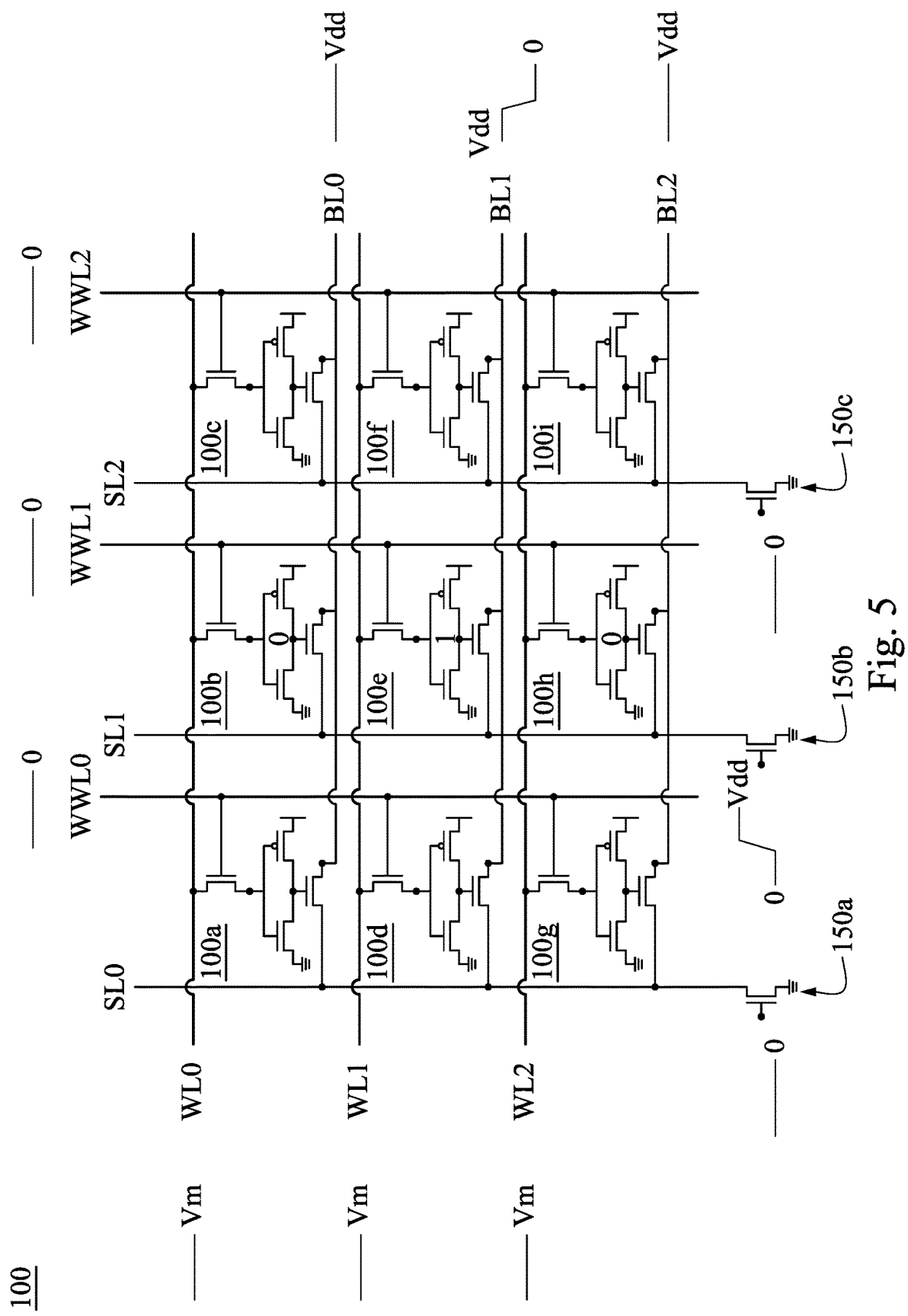
FIG. 5 is a schematic drawing illustrating an exemplary memory circuit at a reading operation according to some embodiments of the present disclosure.

Reading—FIG. 5 is a schematic drawing illustrating an exemplary memory circuit 100 at a reading operation according to some embodiments of the present disclosure. Assume that the content of the memory cell 100e is a 1, and the memory cells 100b and 100h are 0, stored at their nodes. The read cycle is started by pre-charging all the bit lines BL0-BL2 to Vdd, then charging the gate of the source line transistor 150b to Vdd while other gates of the source line transistor 150a and 150c are set to be 0. Therefore, the source line transistor 150b is turned on and the source line transistor 150a and 150c are turned off. Since the node n of the memory cell 100e stores 1, the fourth transistor 140 of the memory cell 100e is turned on, while other fourth transistors 140 of other memory cells 100b and 100h are turned off (since they stores 0). The ground signal of the source line transistor 150b passes through the source line SL1 and the fourth transistor 140 of the memory cell 100e discharges the bit line BL1 to the ground (or 0V). On the other hand, the fourth transistors 140 of the memory cells 100b and 100h are turned off, such that the bit lines BL0 and BL2 are still at their pre-charged value (Vdd). In some embodiments, the voltage variation (before reading and during reading) at the node n of the inverter I of the memory cell 100b (100h) is less than about 1e-8V, e.g., about 9e-9V, which is much less than the Vdd (about 1.1V). Therefore, this configuration is considered as read disturb free. This read disturb free characteristic may be contributed to the node position. In greater detail, since the storage node is at the gate 140g of the fourth transistor 140, there is no electrically connection between the node n and the bit lines BL0-BL2, the precharged bit lines BL0-BL2 will not disturb the voltage stored at the node n. Further, after the reading operation, the source line transistor 150b is turned off, such that the source line SL1 is floating. The floating source line SL1 prohibits the current flow from the bit lines BL0-BL2 to ground. As such, the storage node has good stability during both writing and reading operations.

In the reading operation, the word lines WL0-WL2 are set to be Vm, and the write word lines WWL0-WWL2 are set to be 0, such that the nodes of the memory cells 100a-100i are at their initial states. In some embodiments, the output signal of the bit lines BL0-BL2 may be amplified by a sense amplifier. In some embodiments, the read access time of the memory circuit 100 may be less than about 2 ns, e.g., about 1.3 ns (as shown in FIG. 22). In some other embodiments, the read access time of the memory circuit 100 may be further improved by increasing the fin number of the source line transistors 150a, 150b, and 150c, increasing the channel width of the source line transistors 150a, 150b, and 150c, and/or applying forward back-gate bias to the source line transistors 150a, 150b, and 150c during read operation (for planar structure device). Moreover, when the first transistors 110, the fourth transistors 140, and/or the source line transistors 150a-150c are FeFET or NCFET, the read access time of the memory circuit 100 can be further improved.

Figure 6:
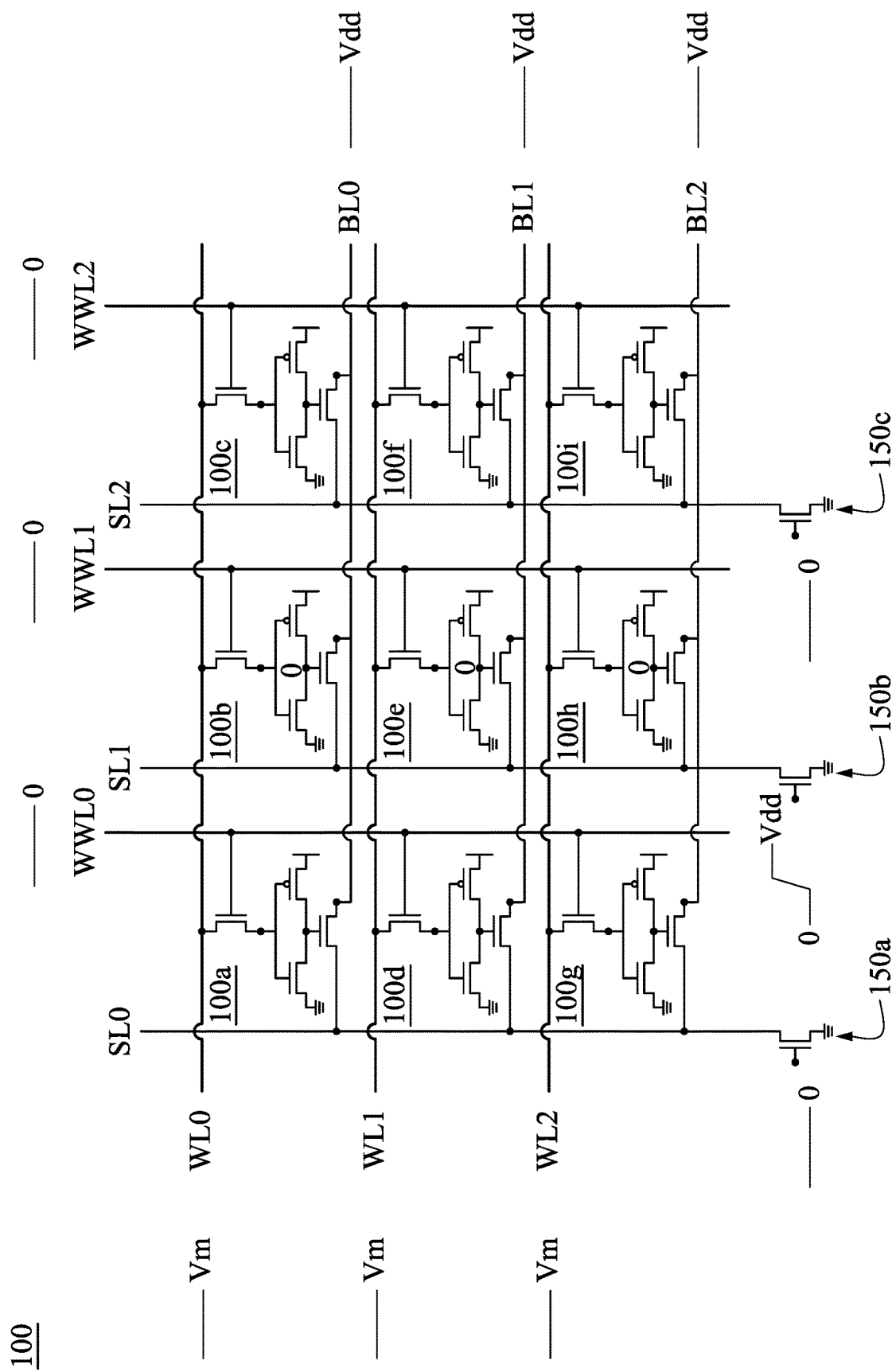
FIG. 6 is a schematic drawing illustrating an exemplary memory circuit at another reading operation according to some embodiments of the present disclosure.

FIG. 6 is a schematic drawing illustrating an exemplary memory circuit 100 at another reading operation according to some embodiments of the present disclosure. Moreover, assume that the content of the memory cell 100e is a 0, and the memory cells 100b and 100h are 0, stored at their nodes. The read cycle is started by pre-charging all the bit lines BL0-BL2 to Vdd, then charging the gate of the source line transistor 150b to Vdd while other gates of the source line transistor 150a and 150c are set to be 0. Therefore, the source line transistor 150b is turned on and the source line transistor 150a and 150c are turned off. Since the node n of the memory cell 100e stores 0, the fourth transistor 140 of the memory cell 100e is turned off, and other fourth transistors 140 of other memory cells 100b and 100h are also turned off (since they stores 0). The ground signal of the source line transistor 150b does not pass through the fourth transistor 140 of the memory cell 100e and thus the bit line BL1 is at its pre-charged value (Vdd). Similarly, the bit lines BL0 and BL2 are still at their pre-charged values (Vdd). Therefore, this configuration is considered as read disturb free.

Figure 7:
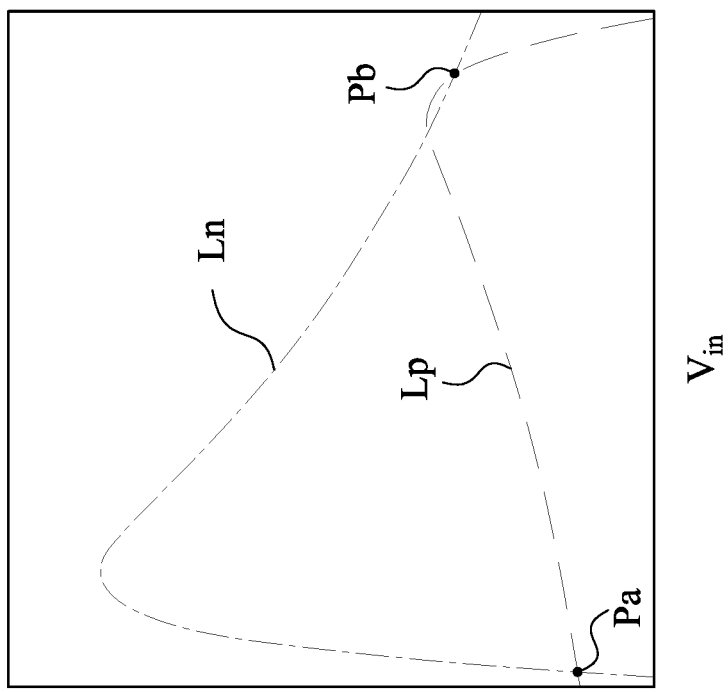
FIG. 7 shows a drain current (Ids) versus gate voltage (Vin) characteristics of a NCFET inverter according to some embodiments of the present disclosure.

FIG. 7 shows a drain current (Ids) versus gate voltage (Vin) characteristics of a NCFET inverter according to some embodiments of the present disclosure. In FIG. 7, line Ln represents the IV curve of an N-type NCFET (e.g., the second transistor 120 in FIG. 2), and line Lp represents the IV curve of a P-type NCFET (e.g., the third transistor 130 in FIG. 2). The lines Ln and Lp have different characteristics, and these two lines form two intersection points Pa and Pb, which means this NCFET inverter may store two different states with different applied voltages. As such, the NCFET inverter having the characteristics shown in FIG. 7 can be used as the inverter I in FIG. 2. Furthermore, the NCFETs shown in FIG. 7 have sub-60 mV/dec subthreshold swing (SS) at room temperature.

Figure 8:
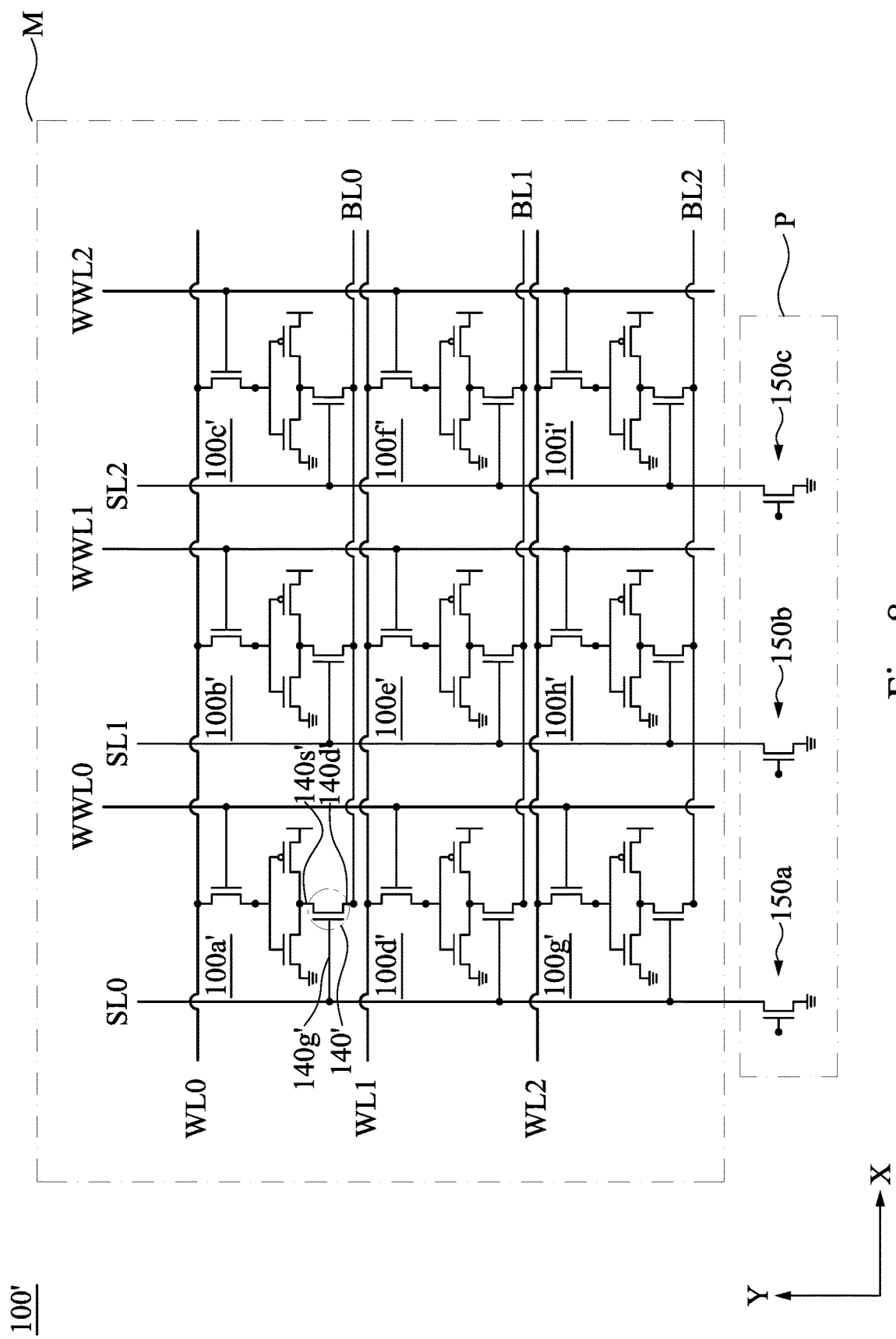
FIG. 8 is a schematic drawing illustrating an exemplary memory circuit 100' according to some embodiments of the present disclosure.

FIG. 8 is a schematic drawing illustrating an exemplary memory circuit 100' according to some embodiments of the present disclosure. The difference between the memory circuits 100' and 100 (see FIG. 1) pertains to the configuration of the fourth transistors. The memory circuits 100' in FIG. 8 includes memory cells 100a', 100b', 100c', 100d', 100e', 100f', 100g', 100h', and 100i' and the source line transistors 150a-150c. Taking the memory cell 100a' as an example, the gate 140g' of the fourth transistor 140' is connected to the source line SL0, the source 140s' of the fourth transistor 140' is connected to the drains of the second transistor 120 and the third transistor 130, and the drain 140d' of the fourth transistor 140' is connected to the bit line BL0. Since the fourth transistors of the memory cells 100b'-100i' have similar configuration, and the detailed descriptions therein are not repeated hereinafter. The memory circuit 100' has the same writing operation as the memory circuit 100 in FIG. 1. For the reading operation, the fourth transistor 140' of the selected memory cell is turned on, the node of the selected memory cell will discharge the corresponding bit line if the node stores "0", and the corresponding bit line maintains its initial value if the node stores "1".

Figure 9A:
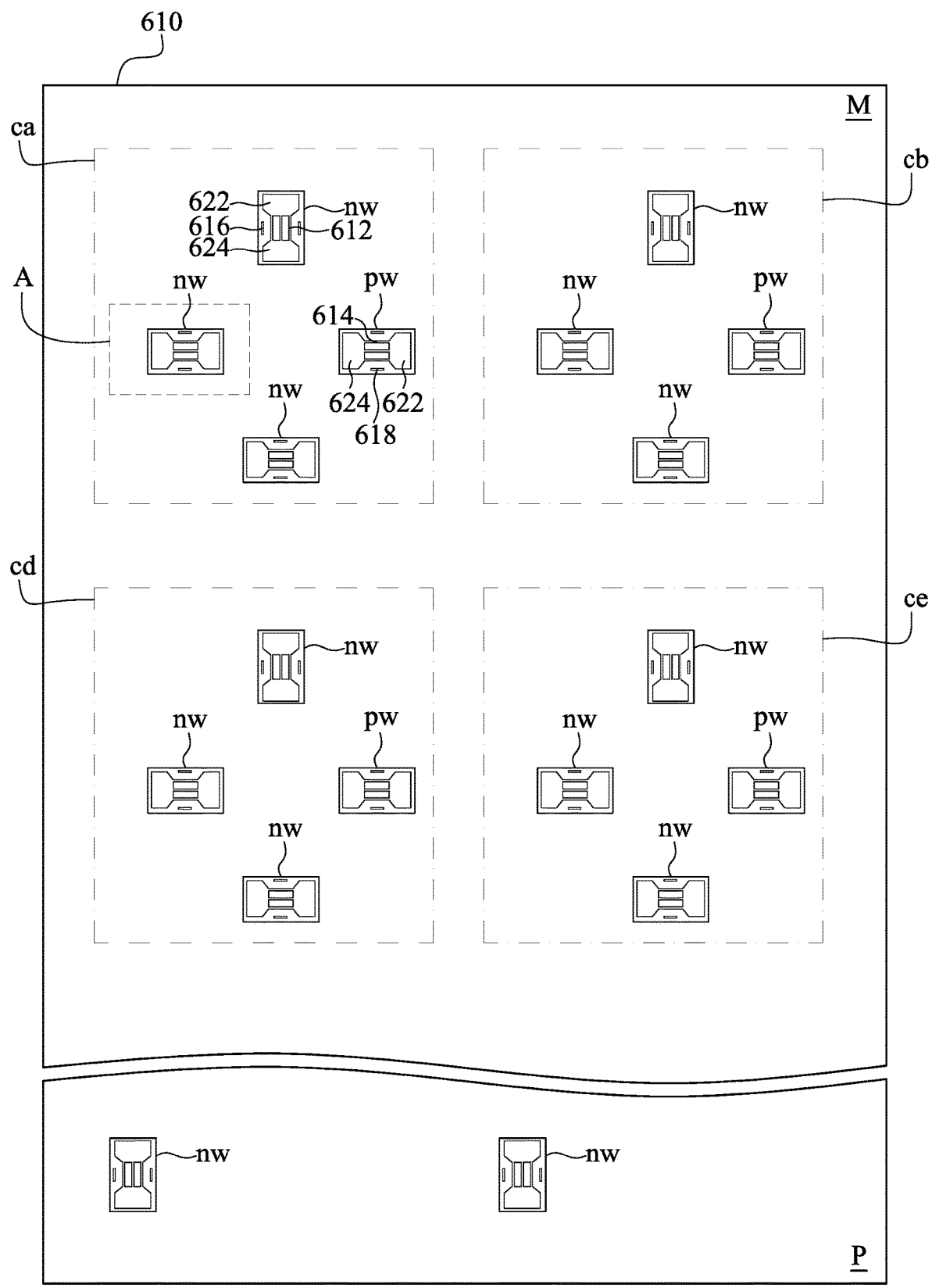
FIGS. 9A to 17 illustrate a method in various stages of fabricating a memory circuit in accordance with some embodiments of the present disclosure.
Figure 9B:
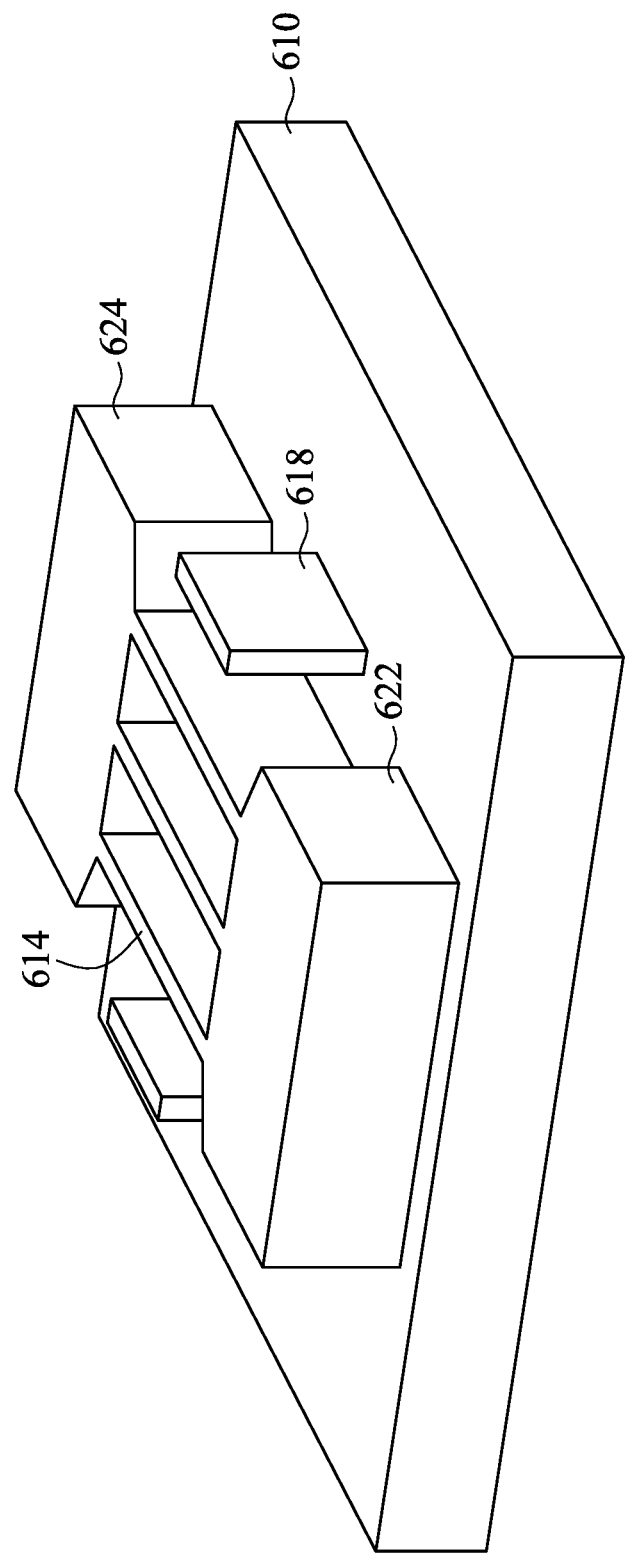
Figure 10:
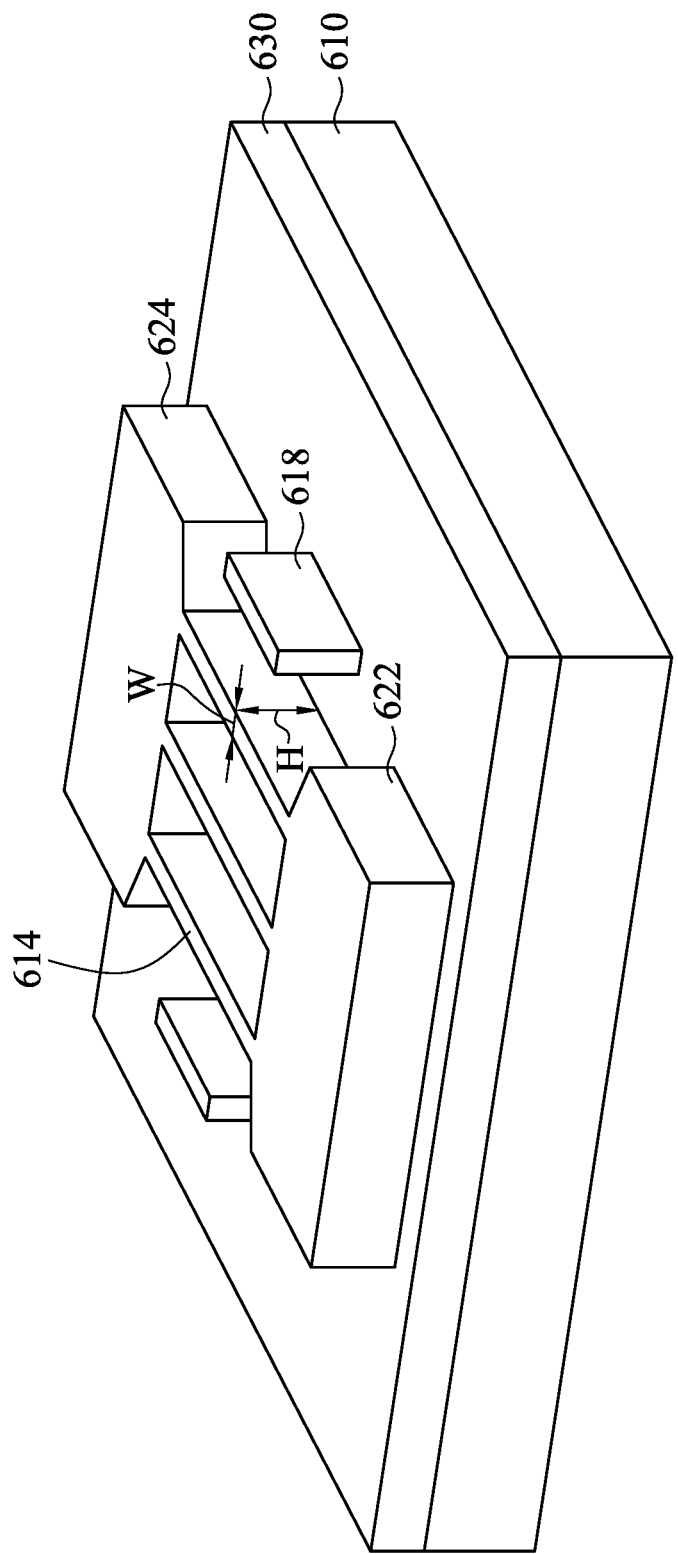

FIGS. 9A to 17 illustrate a method in various stages of fabricating a memory circuit in accordance with some embodiments of the present disclosure. In some embodiments, the memory cells 100a, 100b, 100d, and 100e and the source line transistors 150a and 150b shown in FIG. 1 may be fabricated using the processes shown in FIGS. 9A to 17. Reference is made to FIGS. 9A and 9B, where FIG. 9B is a perspective view of the area A shown in FIG. 9A. A substrate 610 is provided. The substrate 610 includes a memory region M and a peripheral region P adjacent the memory region M. A memory cell 500a (see FIG. 11A) will be formed in a cell region ca in the memory region M, a memory cell 500b (see FIG. 11A) will be formed in a cell region cb in the memory region M, a memory cell 500d (see FIG. 11A) will be formed in a cell region cd in the memory region M, a memory cell 500e (see FIG. 11A) will be formed in a cell region ce in the memory region M, and source line transistor 550a and 550b (see FIG. 11A) will be formed in the peripheral region P. The memory cells 500a, 500b, 500d, and 500e have similar or the same configuration/structure. It is noted that although FIG. 9B only illustrate the structure formed in the area A, other transistors shown in FIG. 11A may have the same or similar manufacturing processes and structure as shown in FIGS. 9B, 10, and 11B.

In some embodiments, the substrate 610 may include silicon (Si). Alternatively, the substrate 610 may include germanium (Ge), silicon germanium, gallium arsenide (GaAs), germanium-tin (GeSn), or other appropriate semiconductor materials. Also alternatively, the substrate 610 may include an epitaxial layer. For example, the substrate 610 may have an epitaxial layer overlying a bulk semiconductor. Further, the substrate 610 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 610 may include a semiconductor-on-insulator (SOI) structure such as a buried dielectric layer. Also alternatively, the substrate 610 may include a buried dielectric layer such as a buried oxide (BOX) layer, such as that formed by a method referred to as separation by implantation of oxygen (SIMOX) technology, wafer bonding, SEG, or other appropriate method. In various embodiments, the substrate 610 may include any of a variety of substrate structures and material.

The substrate 610 includes N-well regions nw and P-well regions pw. Each of the cell regions ca, cb, cd, and ce includes three N-well regions nw and one P-well region pw. The N-well regions nw corresponds to the positions where the first transistor 510, the second transistor 520, and the fourth transistor 540 are formed, and the P-well region pw corresponds to the position where the third transistor 530 is formed. Further, some of the N-well regions nw are formed in the peripheral region P of the substrate 610, and these N-well regions nw corresponds to the positions where the source line transistors 550a and 550b are formed.

The substrate 610 includes a plurality of semiconductor fins 612 and 614, dummy fins 616 and 618, and source/drain pads 622 and 624 protruded from the substrate 610. The semiconductor fins 612 and 614 serve as source/drain features of following formed transistors, and the dummy fins 616 and 618 are respectively formed adjacent the semiconductor fins 612 and 614. The dummy fins 616 and 618 have no functionality in the semiconductor device but make the device processes more uniform, more reproducible, and more manufacturable. The semiconductor fins 612 and 614 have functionality in the semiconductor device. Both the source/drain pads 622 and 624 are electrically and physically connected to the ends of the semiconductor fins 612 (614). Contacts can be formed on the source/drain pads 622 and 624. The semiconductor fins 612 and 614 extend in different directions. For example, the semiconductor fins 612 are substantially perpendicular to the semiconductor fins 614. The dummy fins 616 are on opposite sides of the semiconductor fins 612, and the dummy fins 618 are on opposite sides of the semiconductor fins 614. The dummy fins 616 are substantially parallel to the semiconductor fins 612, and the dummy fins 618 are substantially parallel to the semiconductor fins 614. In some embodiments, the semiconductor fins 612 and the dummy fins 616 have different lengths, e.g., the dummy fins 616 are shorter than the semiconductor fins 612. Similarly, the semiconductor fins 614 and the dummy fins 618 have different lengths, e.g., the dummy fins 618 are shorter than the semiconductor fins 614. It is note that the numbers of the semiconductor fins 612 and 614 and the dummy fins 616 and 618 in FIGS. 9A and 9B are illustrative, and should not limit the claimed scope of the present disclosure.

The semiconductor fins 612 and 614, dummy fins 616 and 618, and the source/drain pads 622 and 624 may be formed, for example, by patterning and etching the substrate 610 using photolithography techniques. In some embodiments, a layer of photoresist material (not shown) is deposited over the substrate 610. The layer of photoresist material is irradiated (exposed) in accordance with a desired pattern (the semiconductor fins 612 and 614 and the dummy fins 616 and 618 in this case) and developed to remove a portion of the photoresist material. The remaining photoresist material protects the underlying material from subsequent processing operations, such as etching. It should be noted that other masks, such as an oxide or silicon nitride mask, may also be used in the etching process.

In some other embodiments, the semiconductor fins 612 and 614, the dummy fins 616 and 618, and the source/drain pads 622 and 624 may be epitaxially grown. For example, exposed portions of an underlying material, such as an exposed portion of the substrate 610, may be used in an epitaxial process to form the semiconductor fins 612 and 614, the dummy fins 616 and 618, and the source/drain pads 622 and 624. A mask may be used to control the shape of the semiconductor fins 612 and 614, the dummy fins 616 and 618, and the source/drain pads 622 and 624 during the epitaxial growth process.

Reference is made to FIG. 10. A plurality of isolation features 630, such as shallow trench isolation (STI), are formed on the substrate 610 to separate various devices. The formation of the isolation features 630 may include etching trenches in the substrate 610 (i.e., patterning the substrate 610 to form the structure shown in FIGS. 9A and 9B) and filling the trench by insulator materials such as silicon oxide, silicon nitride, or silicon oxynitride. The filled trench may have a multi-layer structure such as a thermal oxide liner layer with silicon nitride filling the trench. In some embodiments, the isolation features 630 may be created using a process sequence such as: growing a pad oxide, forming a low pressure chemical vapor deposition (LPCVD) nitride layer, patterning an STI opening using photoresist and masking, etching the trenches in the substrate 610 to form the semiconductor fins 612 and 614, the dummy fins 616 and 618, and the source/drain pads 622 and 624, optionally growing a thermal oxide trench liner to improve the trench interface, filling the trenches with CVD oxide, using chemical mechanical planarization (CMP) to remove the excessive dielectric layers, and etching back the remained dielectric layers to form the isolation features 630 such that top portions of the semiconductor fins 612 and 614, the dummy fins 616 and 618, and the source/drain pads 622 and 624 protrude from the isolation features 630.

In FIG. 10, the semiconductor fin 614 has a portion protruding from the isolation structure 630. The portion of the semiconductor fin 614 has a height H and a width W. In some embodiments, the height H is in a range of about 5 nm to about 350 nm, e.g., about 30 nm; the width W is in a range of about 5 nm to about 50 nm, e.g., about 10 nm. The semiconductor fin 612 has the same or similar dimension, and is not repeated herein.

Figure 11A:
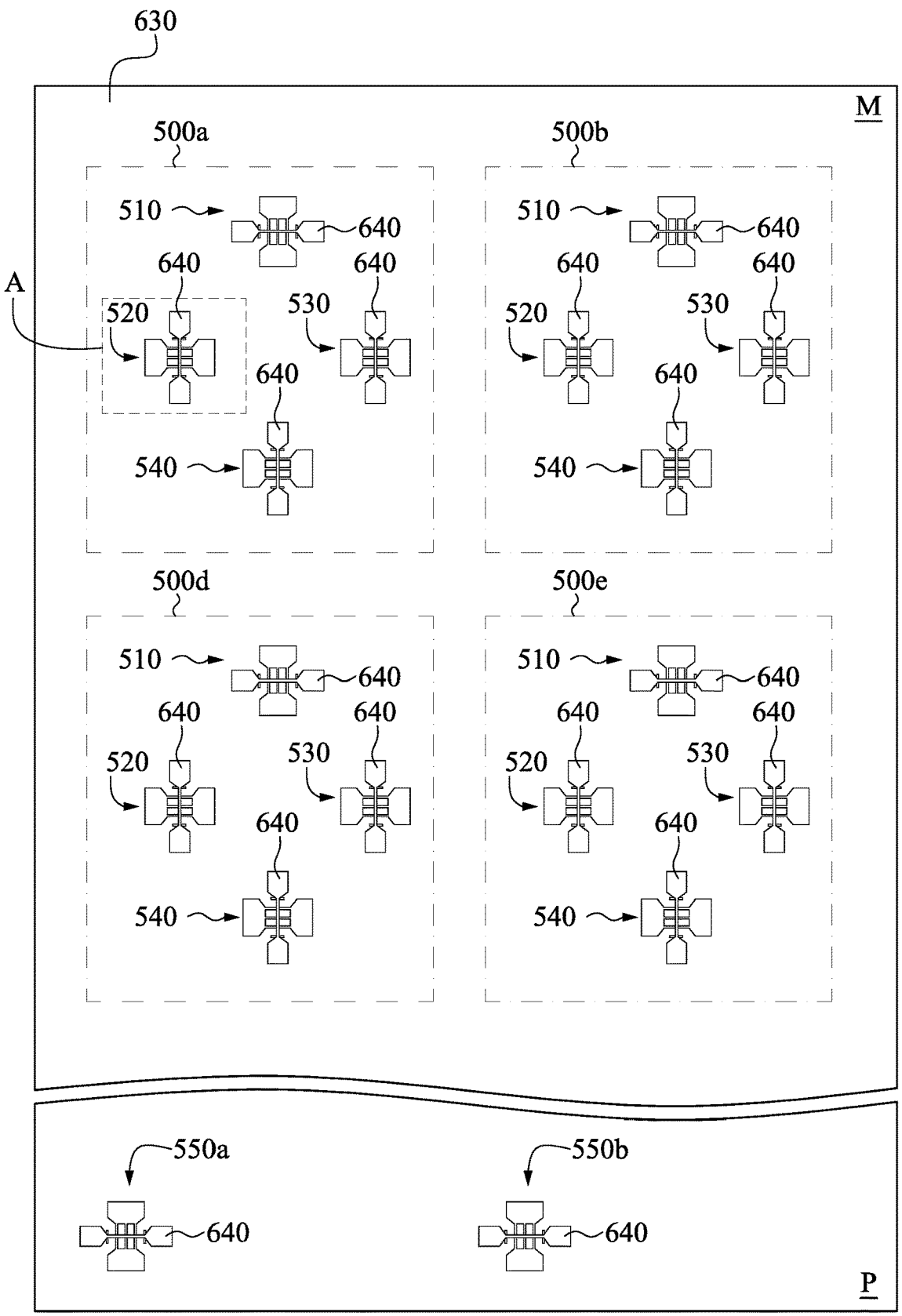
Figure 11B:
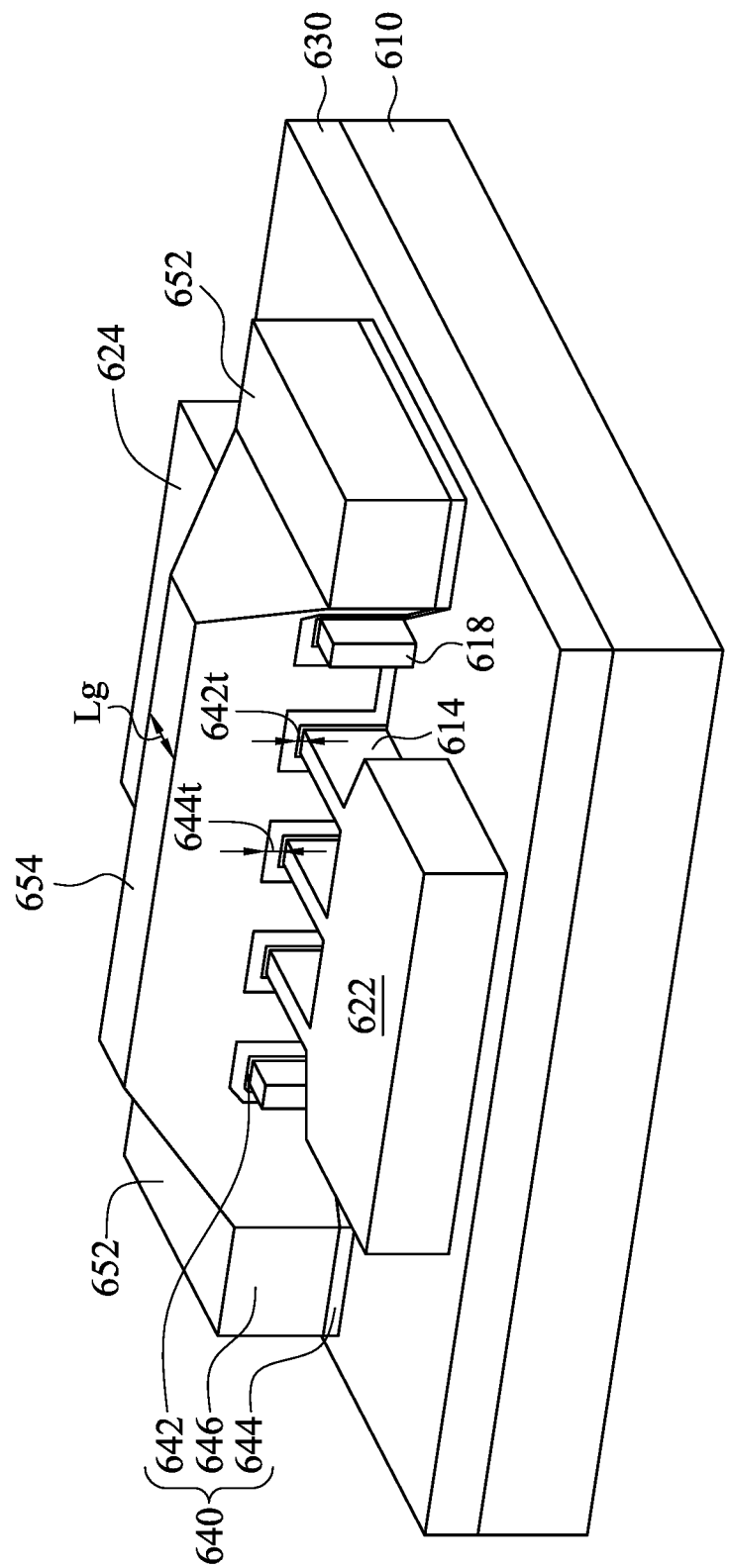

Reference is made to FIGS. 11A and 11B. Gate structures 640 are conformally formed over the semiconductor fins 612 (614) and the dummy fins 616 (618). As shown in FIG. 11B, the gate structure 640 includes interfacial layers 642, a ferroelectric layer 644, and a gate electrode 646. The interfacial layers 642 respectively covers portions (i.e., channels) of the semiconductor fins 612 (614) and portions of the dummy fins 616 (618). The ferroelectric layer 644 is formed over the interfacial layers 642 and the isolation structures 630, such that the ferroelectric layer 644 is in contact with the isolation structures 630 in some embodiments. The gate electrode 646 is formed over the ferroelectric layer 644, and the gate electrode 646 is in contact with the ferroelectric layer 644 in some embodiments.

In some embodiments, the gate structures 640 may be formed by sequentially forming interfacial films over the semiconductor fins 612 and 614, the dummy fins 616 and 618, and the source/drain pads 622 and 624, forming a ferroelectric material over the interfacial films and the isolation structures 630, and forming a conductive material over the ferroelectric material (i.e. ferroelectric film). Then, the conductive material, the ferroelectric material, and the interfacial films are patterned to form the gate structures 640. In some embodiments, the interfacial layers 642 may include silicon dioxide, silicon nitride, a high-K dielectric material or other suitable material. In various examples, the interfacial layers 642 may be formed by thermal oxidize the semiconductor fins 612 and 614, the dummy fins 616 and 618, and the source/drain pads 622 and 624, such that the interfacial layers 642 is not formed on the isolation structure 630. Alternatively, the interfacial layers 642 may be deposited by an ALD process, a CVD process, a subatmospheric CVD (SACVD) process, a flowable CVD process, a PVD process, or other suitable process. By way of example, the interfacial layers 642 may be used to prevent damage to the semiconductor fins 612 and 614 by subsequent processing (e.g., subsequent formation of the conductive material and the ferroelectric film).

A ferroelectric material has a nonlinear relationship between the applied electric field and the stored charge. Specifically, the ferroelectric characteristic has the form of a hysteresis loop (as shown in FIG. 3), which is very similar in shape to the hysteresis loop of ferromagnetic materials. Semi-permanent electric dipoles are formed in the crystal structure of the ferroelectric material. When an external electric field is applied across a dielectric, the dipoles tend to align themselves with the field direction, produced by small shifts in the positions of atoms and shifts in the distributions of electronic charge in the crystal structure. After the charge is removed, the dipoles retain their polarization state.

In some embodiments, the ferroelectric film (and thus the ferroelectric layer 644) includes HfZrO, $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_2$ (BLT), $LaNiO_3$ (LNO), $YMnO_3$, $ZrO_2$, zirconium silicate, ZrAlSiO, $HfO_2$, hafnium silicate, HfAlO, LaAlO, lanthanum oxide, $HfO_2$ doped with Si, $Ta_2O_5$, or combinations thereof. In some embodiments, for an inverter having a clockwise VTC hysteresis loop, the remnant polarization ($P_r$) and coercive field ($E_c$) of the ferroelectric layer 644 are not zero. For a HfZrO material, the remnant polarization is about 14 μC/cm$^2$ and the coercive field is about 1.3 MV/cm. For an inverter having a counter-clockwise VTC hysteresis loop, the remnant polarization ($P_r$) and coercive field ($E_c$) of the ferroelectric layer 644 are not zero. Further, a charge density at the interface between the semiconductor fin 612 (614) and the interfacial layer 642 is greater than about 10$^9$ cm$^{-2}$.

In some embodiments, a thickness 642$t$ of the interfacial layer 642 is in a range between about 0 nm and about 25 nm, e.g., about 0.8 nm. In some embodiments, a thickness 644$t$ of the ferroelectric layer 644 is in a range between about 1 nm and about 30 nm, e.g., about 5 nm. In some embodiment, a channel length Lg of the gate structure 640 is in a range between about 10 nm to about 10000 nm, e.g., about 50 nm. In some embodiments, the VTC hysteresis loop can be enlarged by thickening the ferroelectric layer 644 (increasing the thickness 644$t$) and/or thinning the interfacial layer 642 (decreasing the thickness 642$t$).

In some embodiments, the gate electrode 646 includes one or more work function layers. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For an n-type transistor (such as the first transistor 510, the second transistor 520, the fourth transistor 540, and/or the source line transistors 550$a$ and 550$b$), one or more of TaN, TaAlC, TiN, TiC, Co, TiAl, HfTi, TiSi and TaSi is used as the work function layer, and for a p-type transistor (such as the third transistor 530), one or more of TiAlC, Al, TiAl, TaN, TaAlC, TiN, TiC and Co is used as the work function layer.

Reference is made to FIG. 11B. In some embodiments, the gate structure 640 includes two pad portions 652 and a neck portion 654 between the pad portions 652. The neck portion 654 has a width (i.e., the channel length Lg) less than the pad portions 652. Contacts can be formed on the pad portions 652. The pad portions 652 are formed over the isolation structure 630, and the neck portion 654 crosses over the semiconductor fins 612 (614) and the dummy fins 616 (618).

In FIG. 11A, a plurality of memory cells 500$a$, 500$b$, 500$d$, and 500$e$ are formed on the substrate 610. Take the memory cell 500$a$ as an example. The memory cell 500$a$ includes a first transistor 510, a second transistor 520, a third transistor 530, and a fourth transistor 540. In some embodiments, the first transistor 510 has the same configuration as the second transistor 520 except that they have different orientations. The memory cells 500$b$, 500$d$, and 500$e$ have the same configuration/structure as the memory cell 500$a$, so the detailed descriptions thereof are not repeated herein. Further, source line transistors 550$a$ and 550$b$ are formed on the substrate 610. The source line transistors 550$a$ and 550$b$ may have the configuration shown in FIG. 11B.

It is noted that the first transistor 510, the second transistor 520, the third transistor 530, the fourth transistor 540, and the source line transistors 550$a$ and 550$b$ in FIG. 11A have the same configurations. In some other embodiments, however, the first transistor 510, the second transistor 520, the third transistor 530, the fourth transistor 540, and the source line transistors 550$a$ and 550$b$ may have different configurations. For example, the second transistor 520 and the third transistor 530 may both be FeFETs or NCFETs. The first transistor 510, the fourth transistor 540, and the source line transistors 550$a$ and 550$b$ may be FeFETs, NCFETs, or MOSFETs.

Figure 12:
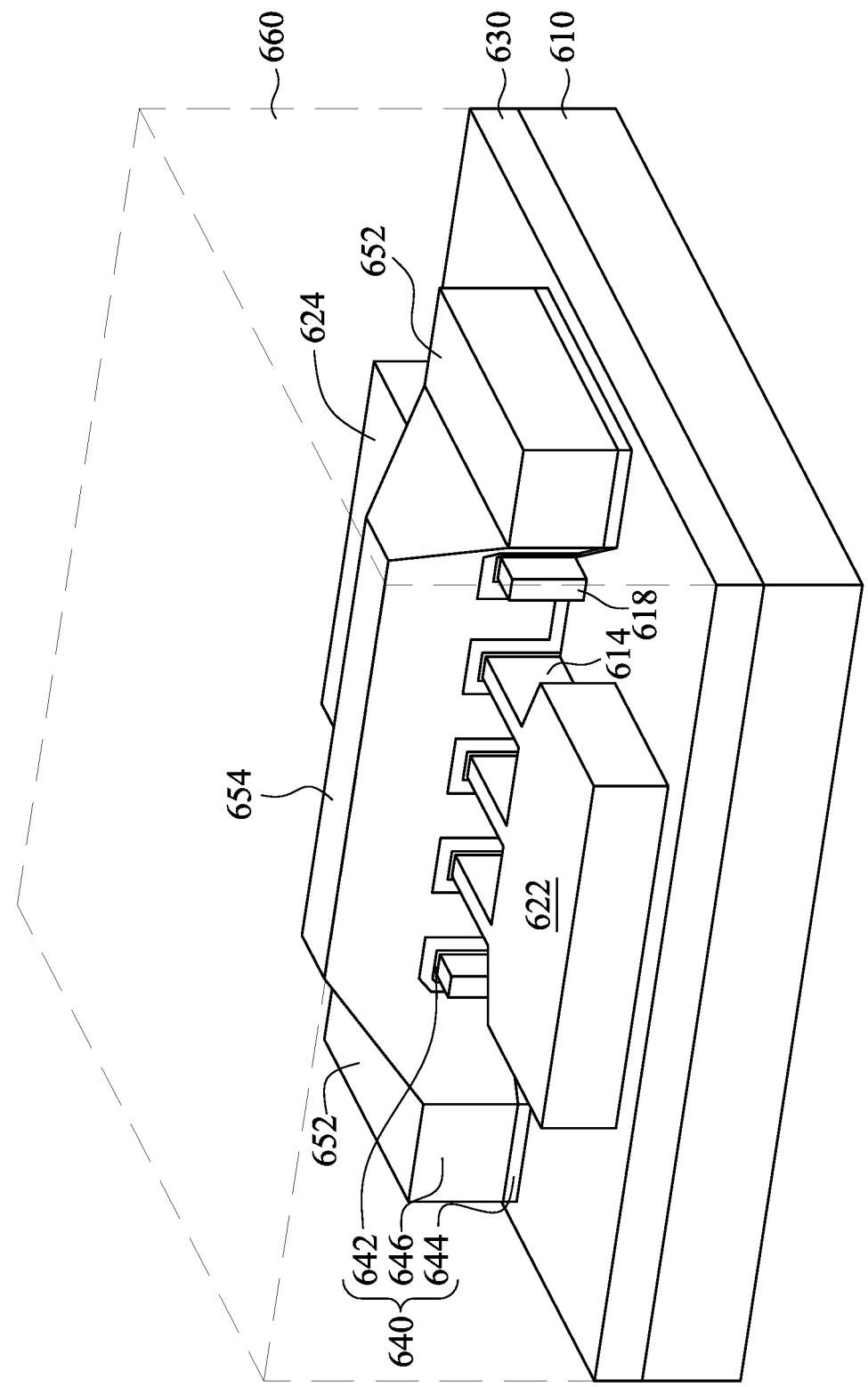

Reference is made to FIG. 12. An interlayer dielectric (ILD) 660 is formed over the structure of FIG. 11A (i.e., over the substrate 610). The ILD 660 may be formed by chemical vapor deposition (CVD), high-density plasma CVD, spin-on, sputtering, or other suitable methods. In some embodiments, the ILD 660 includes silicon oxide. In some other embodiments, the ILD 660 may include silicon oxy-nitride, silicon nitride, or a low-k material. An annealing process may be performed to the ILD 660 to cure the ILD 660.

In some embodiments, a contact etch stop layer (CESL) may be conformally formed over the structure of FIG. 11A before the ILD 660 is formed. In some embodiments, the CESL may be a stressed layer or layers. In some embodiments, the CESL has a tensile stress and is formed of Si$_3$N$_4$. In some other embodiments, the CESL includes materials such as oxynitrides. In yet some other embodiments, the CESL may have a composite structure including a plurality of layers, such as a silicon nitride layer overlying a silicon oxide layer. The CESL can be formed using plasma enhanced CVD (PECVD), however, other commonly used methods such as low pressure CVD (LPCVD), atomic layer deposition (ALD), and the like can also be used.

Figure 13A:
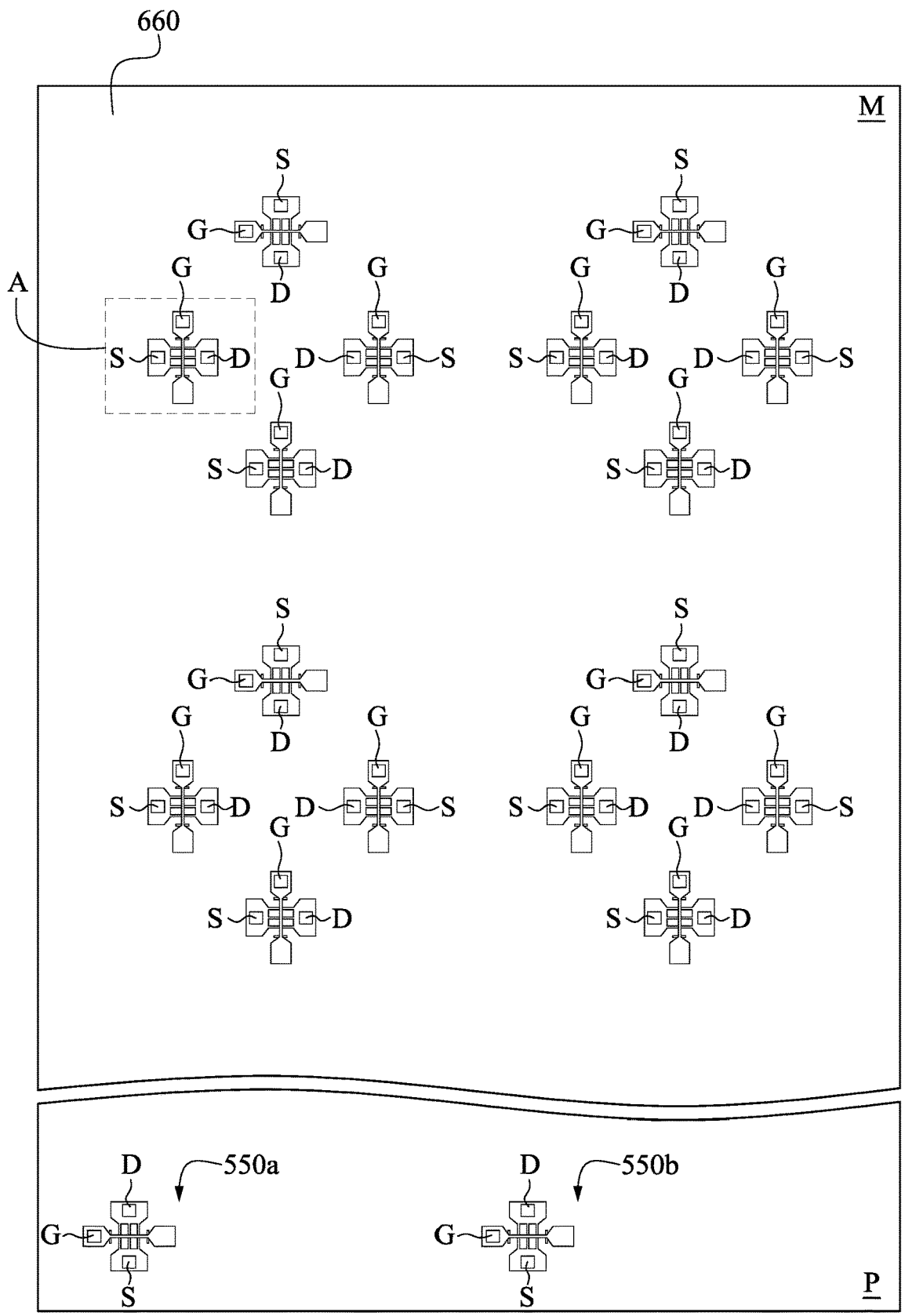
Figure 13B:
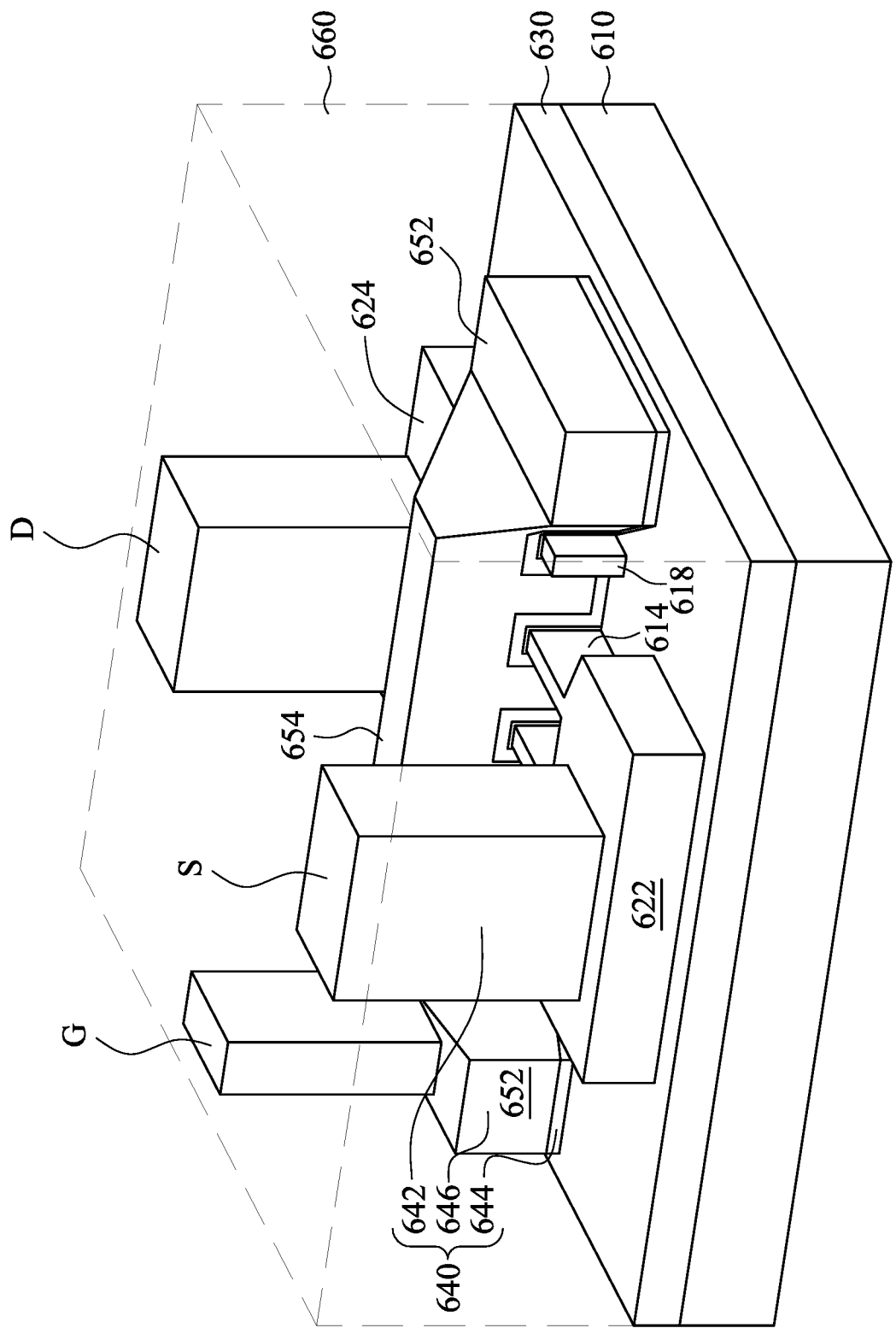

Reference is made to FIGS. 13A and 13B, where FIG. 13B is a perspective view of the area A in FIG. 13A. A plurality of contacts S, D, and G are formed in the ILD 660. The contacts S are respectively formed over the source/drain pads 622, the contacts D are respectively formed over the source/drain pads 624, and the contacts G are respectively formed over the pad regions 652.

In some embodiments, the ILD 660 is etched to form a plurality of openings by various methods, including a dry etch, a wet etch, or a combination of dry etch and wet etch. The openings extend through the ILD 660 and expose the source/drain pads 622, 624, or the pad regions 652. Filling materials are then formed in the openings. The filling materials are connected to the source/drain pads 622, 624 or the pad regions 652. In some embodiments, the filling materials may be filled in the openings, and excessive portions of the filling materials are removed by performing a CMP process to form the contacts S, D, and G. The contacts S, D, and G may be made of tungsten, aluminum, copper, or other suitable materials.

Figure 14:
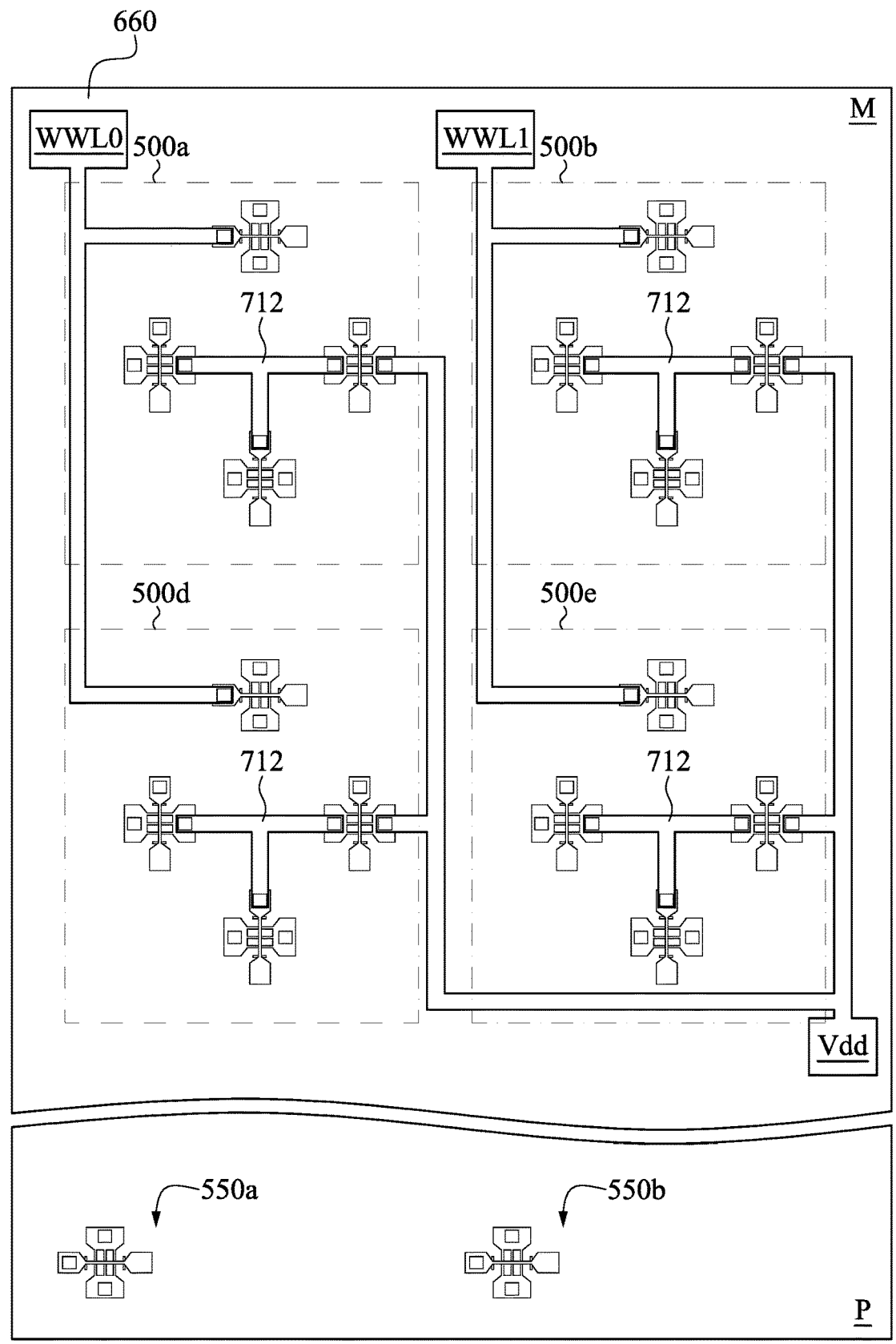

Reference is made to FIGS. 11A, 13A, and 14. A first interconnect layer is formed over the structure of FIG. 13A (i.e., the memory cells 500$a$, 500$b$, 500$d$, 500$e$, and the source line transistors 550$a$ and 550$b$). The first interconnect layer includes various metal lines. In some embodiments, the first interconnect layer includes write word lines WWL0 and WWL1, a power line Vdd', and metal lines 712. The write word line WWL0 is electrically connected to the pad region 652 of the first transistors 510 of the memory cells 500$a$ and 500$d$ through the respective contacts G. The write word line WWL1 is electrically connected to the pad region 652 of the first transistors 510 of the memory cells 500$b$ and 500$e$ through the respective contacts G. The power line Vdd' is electrically connected to the source/drain pads 622 of the third transistors 530 of the memory cells 500$a$, 500$b$, 500$d$, and 500$e$ through the respective contacts S. Further, the metal lines 712 are respectively disposed in the memory cells 500$a$, 500$b$, 500$d$, and 500$e$. Each of the metal lines 712 is electrically connected to the source/drain pads 624 of the second and third transistors 520 and 530 and the pad region 652 of the fourth transistor 540 through the respective contacts D and G. The first interconnect layer is formed over the memory region M of the substrate 610. In some embodiments, the first interconnect layer may be formed by forming a blanket metal layer over the ILD 660, then patterning the metal layer to form the first interconnect layer. In some embodiments, the first interconnect layer may be formed of metallic material, including, for example, W, Ta, Ti or Al, and/or including, for example, the alloys, nitrides, silicides, doped-silicons or carbides thereof, e.g., TiAl, TaAl, TiAlC, $WSi_x$, $TiSi_x$, $TaSi_x$, $CoSi_x$, or combinations thereof.

Figure 15:
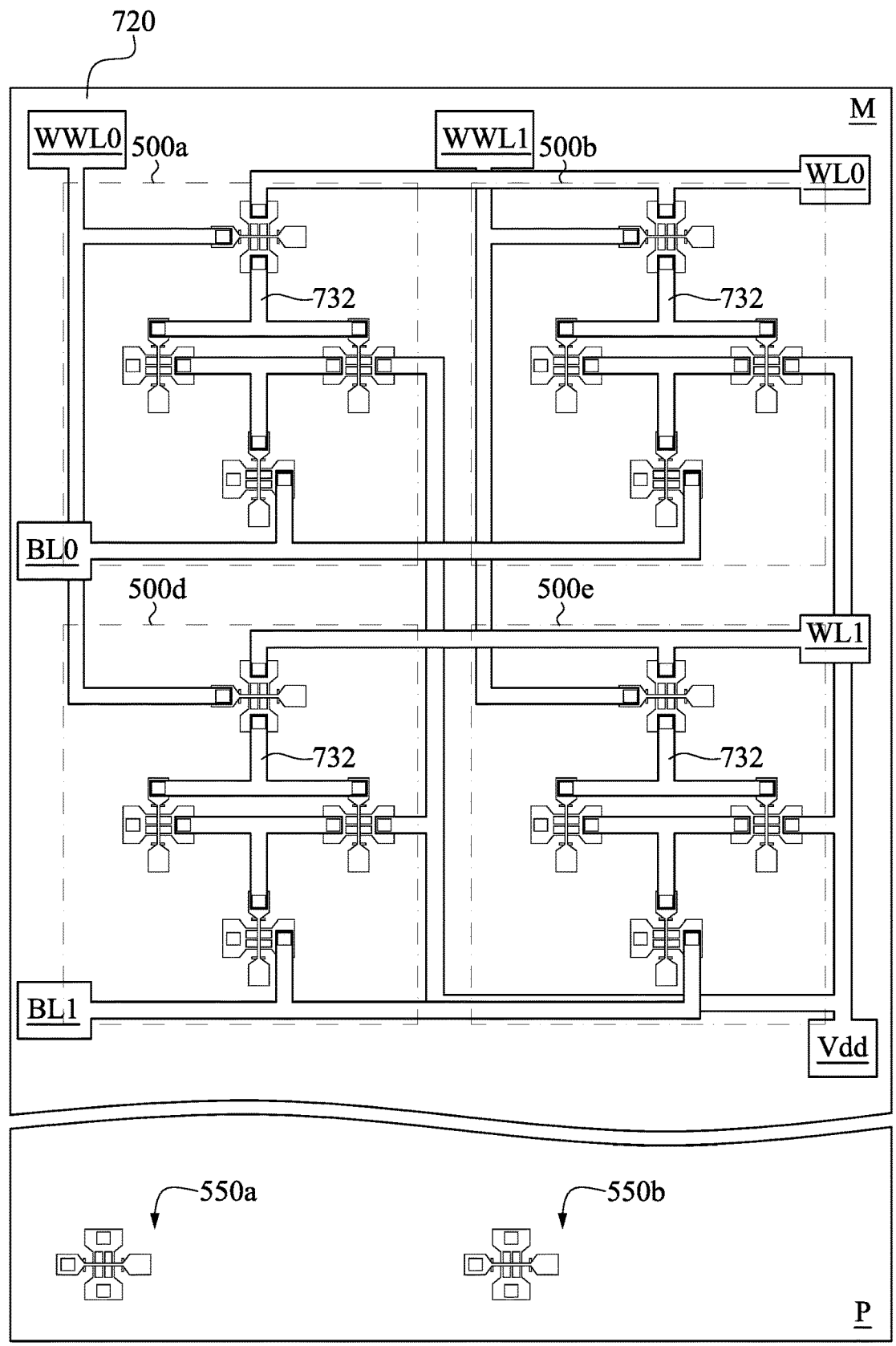

Reference is made to FIGS. 11A, 13A, and 15. A second interconnect layer is formed over the structure of FIG. 14 (i.e., the ILD 660 and the first interconnect layer). More specifically, a first dielectric layer 720 is formed over the ILD 660 and the first interconnect layer. The first dielectric layer 720 may be formed by chemical vapor deposition (CVD), high-density plasma CVD, spin-on, sputtering, or other suitable methods. In some embodiments, the first dielectric layer 720 includes silicon oxide. In some other embodiments, the first dielectric layer 720 may include silicon oxy-nitride, silicon nitride, or a low-k material. An annealing process may be performed to the first dielectric layer 720 to cure the first dielectric layer 720.

Then, the second interconnect layer is formed over the first dielectric layer 720. The second interconnect layer includes various metal lines. In some embodiments, the second interconnect layer includes word lines WL0 and WL1, bit lines BL0 and BL1, and metal lines 732. The word line WL0 is electrically connected to the source/drain pads 622 of the first transistors 510 of the memory cells 500a and 500b through the respective contacts S and vias formed thereon. The word line WL1 is electrically connected to the source/drain pads 622 of the first transistors 510 of the memory cells 500d and 500e through the respective contacts S and vias formed thereon. The bit line BL0 is electrically connected to the source/drain pads 624 of the fourth transistors 540 of the memory cells 500a and 500b through the respective contacts D and vias formed thereon. The bit line BL1 is electrically connected to the source/drain pads 624 of the fourth transistors 540 of the memory cells 500d and 500e through the respective contacts D and vias formed thereon. Further, the metal lines 732 are respectively disposed in the memory cells 500a, 500b, 500d, and 500e. Each of the metal lines 732 is electrically connected to the source/drain pads 624 of the first transistor 510 and the pad regions 652 of the second and third transistors 520 and 530 through the respective contacts D and G and vias formed thereon. The second interconnect layer is formed over the memory region M of the substrate 610.

In some embodiments, a plurality of openings are formed in the first dielectric layer 720 to expose the corresponding contacts S, D, and G. Then, vias are formed in the openings of the first dielectric layer 720 to interconnect the second interconnect layer and the corresponding contacts S, D, and G. The second interconnect layer is then formed by, for example, forming a blanket metal layer over the first dielectric layer 720, then patterning the metal layer to form the second interconnect layer. In some embodiments, the second interconnect layer may be formed of metallic material, including, for example, W, Ta, Ti or Al, and/or including, for example, the alloys, nitrides, silicides, doped-silicons or carbides thereof, e.g., TiAl, TaAl, TiAlC, $WSi_x$, $TiSi_x$, $TaSi_x$, $CoSi_x$, or combinations thereof.

Figure 16:
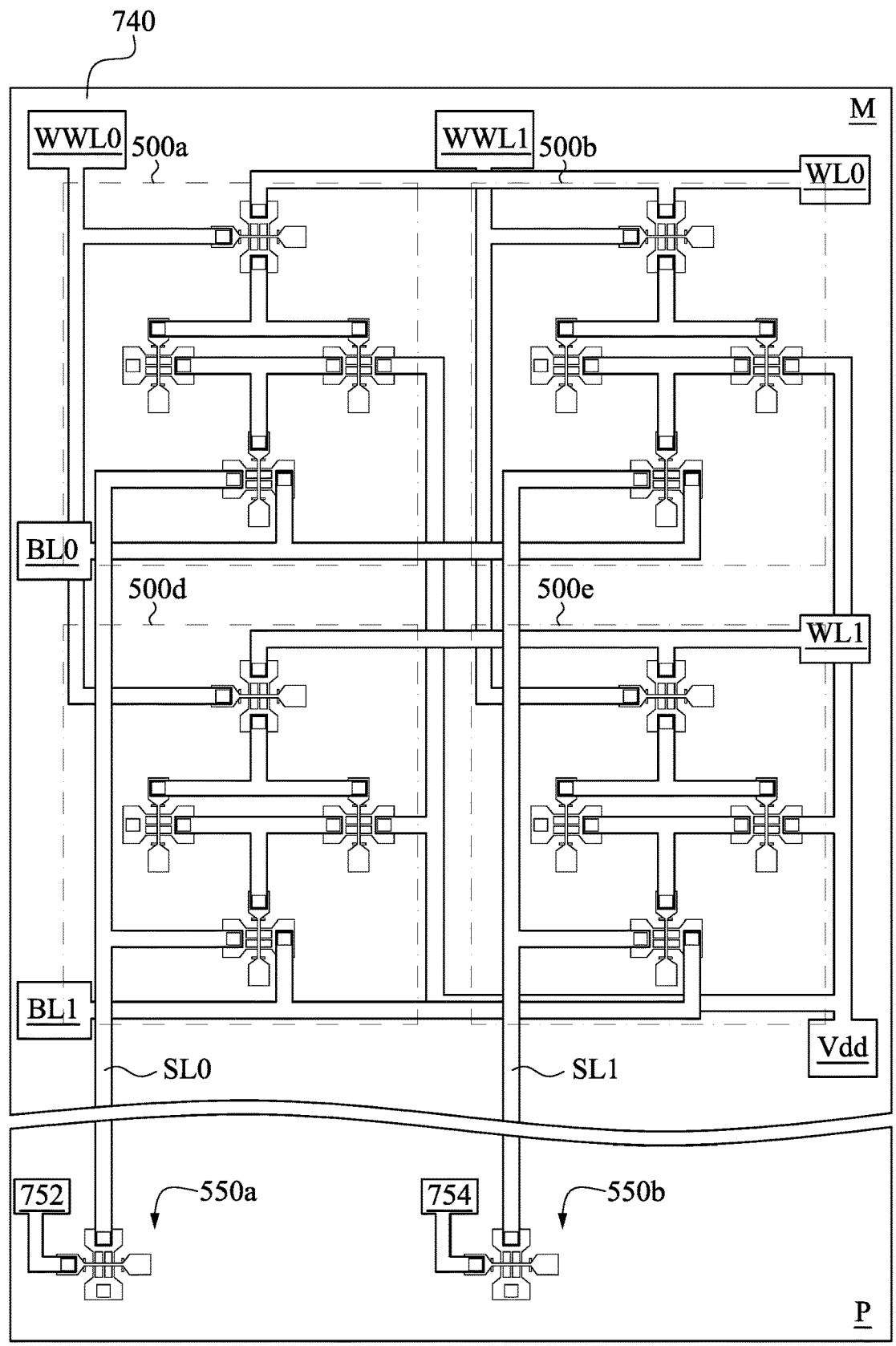

Reference is made to FIGS. 11A, 13A, and 16. A third interconnect layer is formed over the structure of FIG. 15 (i.e., the first dielectric layer 720 and the second interconnect layer). More specifically, a second dielectric layer 740 is formed over the first dielectric layer 720 and the second interconnect layer. The second dielectric layer 740 may be formed by chemical vapor deposition (CVD), high-density plasma CVD, spin-on, sputtering, or other suitable methods. In some embodiments, the second dielectric layer 740 includes silicon oxide. In some other embodiments, the second dielectric layer 740 may include silicon oxy-nitride, silicon nitride, or a low-k material. An annealing process may be performed to the second dielectric layer 740 to cure the second dielectric layer 740.

Then, the third interconnect layer is formed over the second dielectric layer 740. The third interconnect layer includes various metal lines. In some embodiments, the third interconnect layer includes source lines SL0 and SL1 and source pads 752 and 754. The source line SL0 is electrically connected to the source/drain pads 622 of the fourth transistors 540 of the memory cells 500a and 500d through the respective contacts S and vias formed thereon. The source line SL1 is electrically connected to the source/drain pads 622 of the fourth transistors 540 of the memory cells 100b and 100e through the respective contacts S and vias formed thereon. The source pad 752 is electrically connected to the pad region 652 of the source line transistor 550a through the respective contacts G and vias formed thereon. The source pad 754 is electrically connected to the pad region 652 of the source line transistor 550b through the respective contacts G and vias formed thereon. The source lines SL0 and SL1 are formed over the memory region M of the substrate 610 and extend to the peripheral region P, and the source pads 752 and 754 are formed over the peripheral region P of the substrate 610.

In some embodiments, a plurality of openings are formed in the first and second dielectric layers 720 and 740 to expose the corresponding contacts S and G. Then, vias are formed in the openings of the first and second dielectric layers 720 and 740 to interconnect the third interconnect layer and the corresponding contacts S and G. The third interconnect layer is then formed by, for example, forming a blanket metal layer over the second dielectric layer 740, then patterning the metal layer to form the third interconnect layer. In some embodiments, the third interconnect layer may be formed of metallic material, including, for example, W, Ta, Ti or Al, and/or including, for example, the alloys, nitrides, silicides, doped-silicons or carbides thereof, e.g., TiAl, TaAl, TiAlC, $WSi_x$, $TiSi_x$, $TaSi_x$, $CoSi_x$, or combinations thereof.

Figure 17:
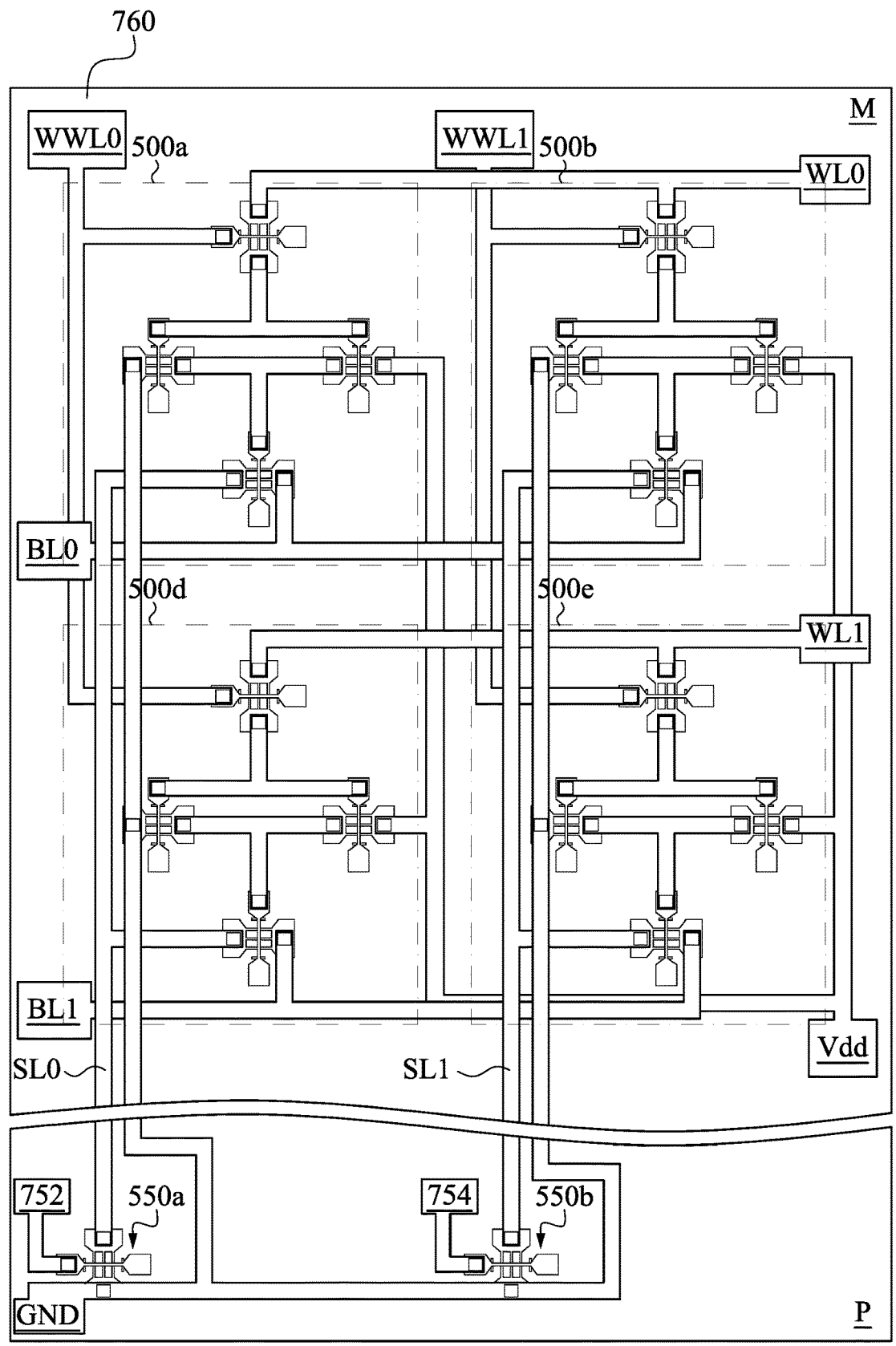

Reference is made to FIGS. 11A, 13A, and 17. A fourth interconnect layer is formed over the structure of FIG. 16 (i.e., the second dielectric layer 740 and the third interconnect layer). More specifically, a third dielectric layer 760 is formed over the second dielectric layer 740 and the third interconnect layer. The third dielectric layer 760 may be formed by chemical vapor deposition (CVD), high-density plasma CVD, spin-on, sputtering, or other suitable methods. In some embodiments, the third dielectric layer 760 includes silicon oxide. In some other embodiments, the third dielectric layer 760 may include silicon oxy-nitride, silicon nitride, or a low-k material. An annealing process may be performed to the third dielectric layer 760 to cure the third dielectric layer 760.

Then, the fourth interconnect layer is formed over the third dielectric layer 760. The fourth interconnect layer includes various metal lines. In some embodiments, the fourth interconnect layer includes a ground line GND. The ground line GND is electrically connected to the source/drain pads 622 of the second transistors 520 of the memory cells 500a, 500b, 500d, and 500e and the source/drain pads 622 of the source line transistors 550a and 550b through the respective contacts S and vias formed thereon. The ground line GND is formed over the memory region M and the peripheral region P of the substrate 610.

In some embodiments, a plurality of openings are formed in the first, second, and third dielectric layer 720, 740, and 760 to expose the corresponding contacts S. Then, vias are formed in the openings of the first, second, and third dielectric layer 720, 740, and 760 to interconnect the fourth interconnect layer and the corresponding contacts S. The fourth interconnect layer is then formed by, for example, forming a blanket metal layer over the third dielectric layer 760, then patterning the metal layer to form the fourth interconnect layer. In some embodiments, the fourth interconnect layer may be formed of metallic material, including, for example, W, Ta, Ti or Al, and/or including, for example, the alloys, nitrides, silicides, doped-silicons or carbides thereof, e.g., TiAl, TaAl, TiAlC, WSi$_x$, TiSi$_x$, TaSi$_x$, CoSi$_x$, or combinations thereof.

It is noted that the formation of the first, second, third, and fourth interconnect layers mentioned above is as an example, the interconnect layers may be formed by other method, such as damascene, dual damascene method, or other suitable methods. Further, the formation sequence of the first, second, third, and fourth interconnect layers mentioned above is also as an example. In some other embodiments, the first interconnect layer may be formed above the second interconnect layer, the second interconnect layer may be formed above the third interconnect layer, and/or the third interconnect layer may be formed above the fourth interconnect layer. Embodiments fall within the present disclosure as long as the first, second, third, and fourth interconnect layers are at different levels.

Figure 18A:
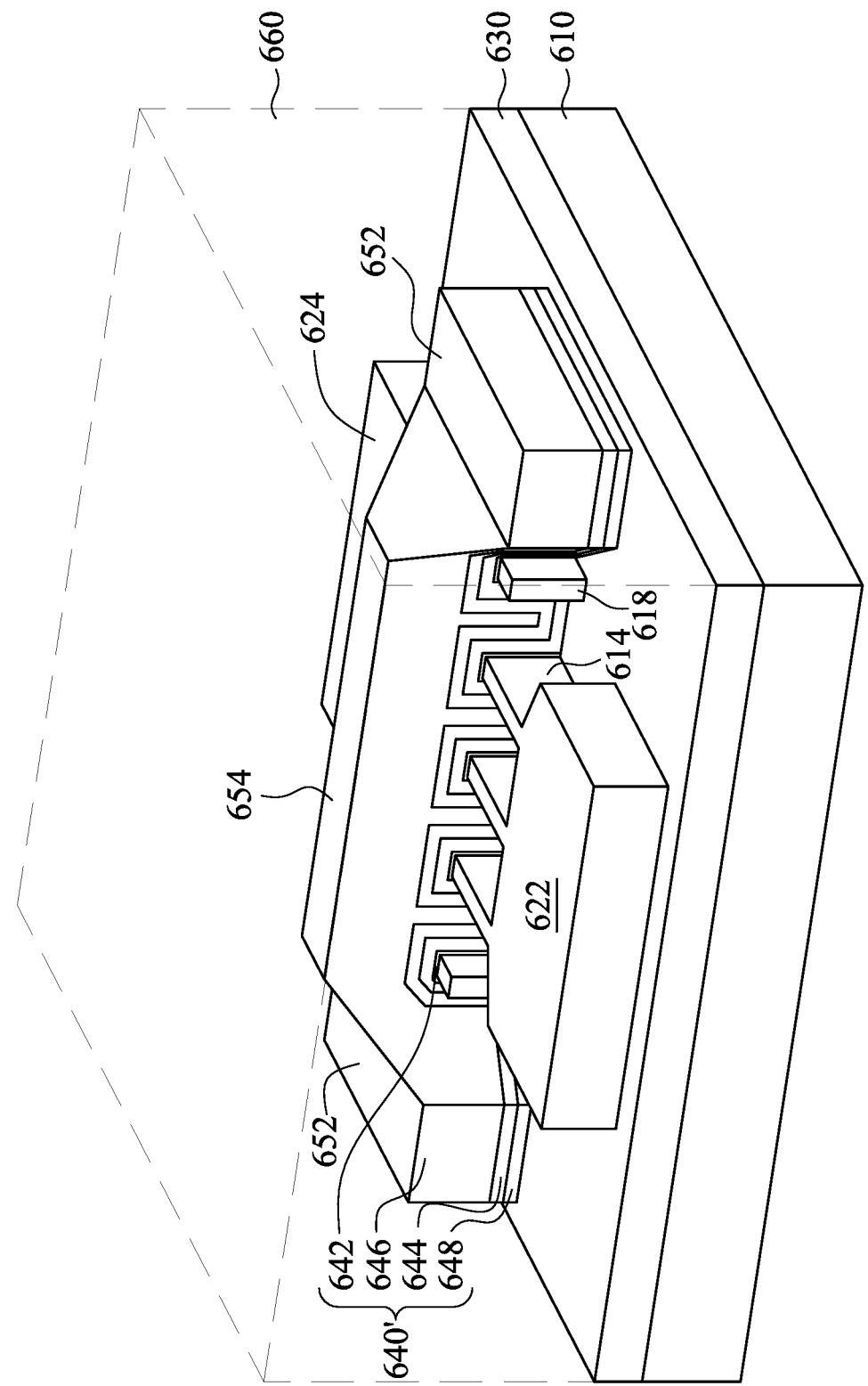
FIGS. 18A and 18B are perspective views of transistors of the memory circuits according to some embodiments.
Figure 18B:
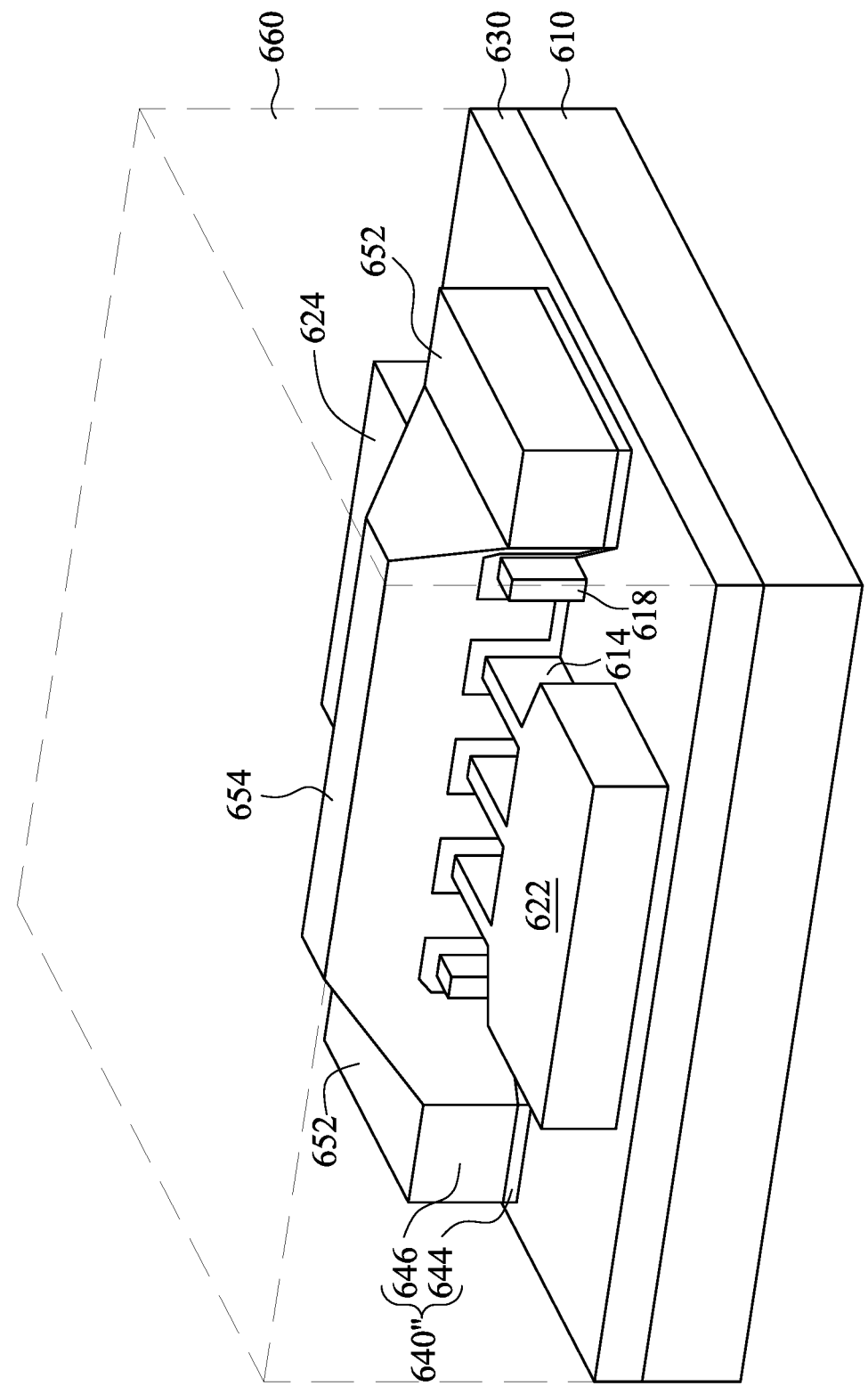

FIGS. 18A and 18B are perspective views of transistors of the memory circuits 100 in FIG. 1 (or 100' in FIG. 8) according to some embodiments. The transistors shown in FIGS. 18A and 18B may be the first transistor 110, the second transistor 120, the third transistor 130, the fourth transistor 140, 140', and/or the source line transistors 150a-150c shown in FIGS. 1 and 8. In FIG. 18A, the gate structure 640' includes interfacial layers 642, a metal layer 648, a ferroelectric layer 644, and a gate electrode 646. The metal layer 648 is over and in contact with the interfacial layers 642 and the isolation structure 630. The ferroelectric layer 644 is over and in contact with the metal layer 648. The gate electrode 646 is over and in contact with the ferroelectric layer 644. That is, the ferroelectric layer 644 is sandwiched between the metal layer 648 and the gate electrode 646. In some embodiments, the metal layer 648 may be made of a metallic material such as Pt, Al, W, Ni, alloys thereof (such as aluminum copper alloy), or metal compound (such as titanium nitride or tantalum nitride). The transistor shown in FIG. 18A may be a FeFET, in which the ferroelectric layer 644 therein has non-zero remnant polarization and coercive field and thus the formed inverter has a VTC hysteresis behavior. The transistor shown in FIG. 18A may be a NCFET having a sub-60 mV/dec subthreshold swing at room temperature and thus the formed inverter has a VTC hysteresis behavior.

In FIG. 18B, the gate structure 640" includes a ferroelectric layer 644 and a gate electrode 646. The ferroelectric layer 644 is over and in contact with the semiconductor fins 612 (614), the dummy fins 616 (618), and the isolation structure 630. The gate electrode 646 is over and in contact with the ferroelectric layer 644. The transistor shown in FIG. 18B may be a FeFET, in which the ferroelectric layer 644 therein has non-zero remnant polarization and coercive field and thus the formed inverter has a VTC hysteresis behavior. The transistor shown in FIG. 18B may be a NCFET having a sub-60 mV/dec subthreshold swing and thus the formed inverter has a VTC hysteresis behavior.

Figure 19:
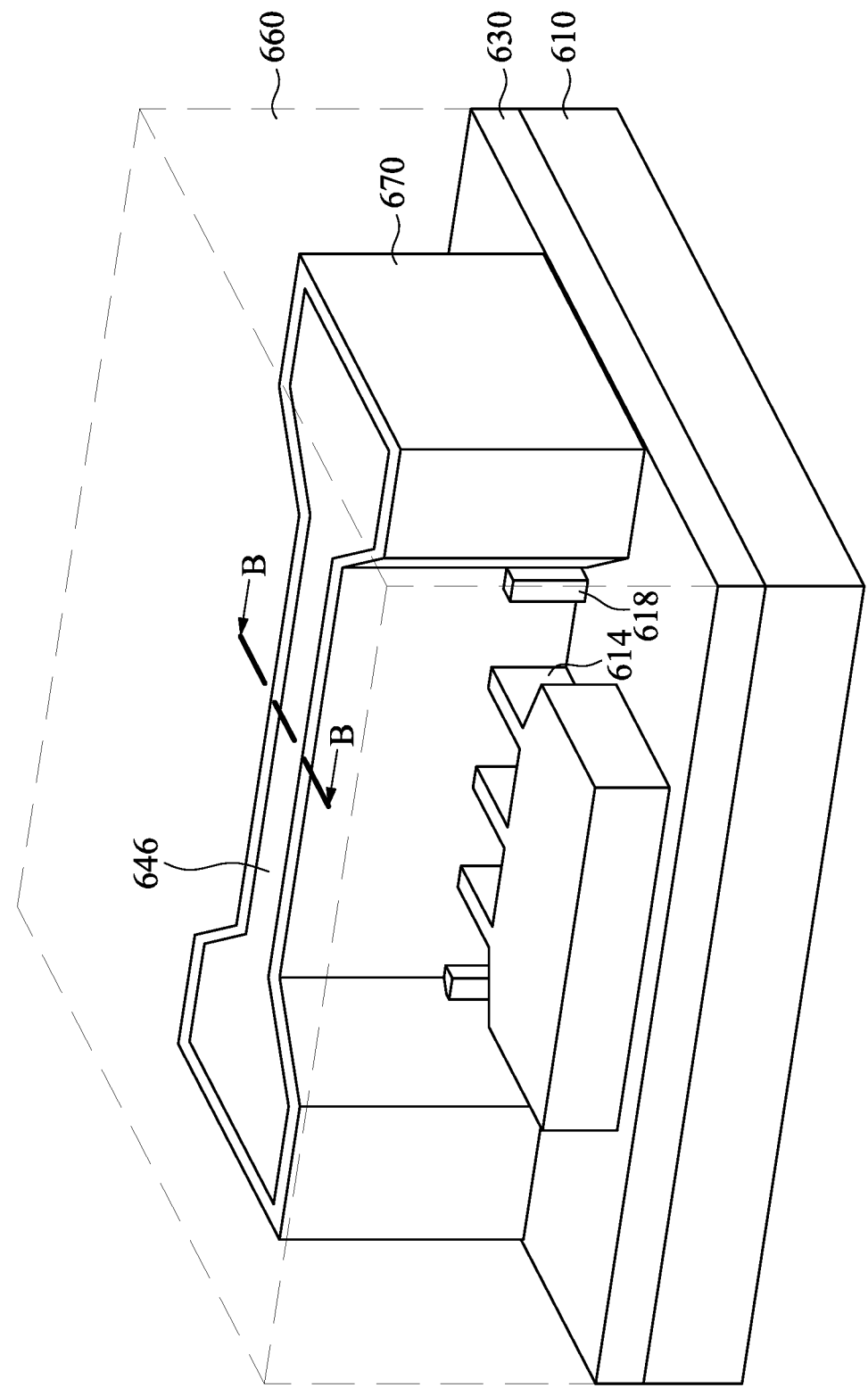
FIG. 19 is a perspective view of a transistor of the memory circuits according to some embodiments.

FIG. 19 is a perspective view of a transistor of the memory circuits 100 in FIG. 1 (or 100' in FIG. 8) according to some embodiments, and FIG. 20 is a cross-sectional view along line B-B in FIG. 19. The transistor shown in FIG. 19 may be the first transistor 110, the second transistor 120, the third transistor 130, the fourth transistor 140, 140', and/or the source line transistors 150a-150c shown in FIGS. 1 and 8. In FIGS. 19 and 20, the transistor further includes a gate spacer 670 surrounding the gate structure. That is, the gate spacer 670 is in contact with the interfacial layers 642, the ferroelectric layer 644, and the gate electrode 646. The gate spacer 670 may be made of one of more layers of insulating material, such as SiO$_2$, SiN and SiON. In some embodiments, the gate spacer 670 may be made of high-k materials (e.g., having a dielectric constant greater than 3.9). For example, the gate spacer 670 may include at least one layer of Hf, Al, Zr, a combination of the metal oxides or silicides thereof, and a multi-layer thereof. Other suitable materials include La, Mg, Ba, Ti, Pb, Zr in the form of metal oxides, metal alloy oxides and combinations thereof. Exemplary materials include MgO$_x$, BaTi$_x$O$_y$, BaSr$_x$Ti$_y$O$_z$, PbTi$_x$O$_y$, PbZr$_x$Ti$_y$O$_z$, SiCN, SiON, SiN, Al$_2$O$_3$, La$_2$O$_3$, Ta$_2$O$_3$, Y$_2$O$_3$, HfO$_2$, ZrO$_2$, HfSiON, YGe$_x$O$_y$, YSi$_x$O$_y$, and LaAlO$_3$.

Methods of forming the gate spacer 670 include molecular-beam deposition (MBD), ALD, PVD, and the like. The high-k gate spacer 670 has a large electron amount on its surface, and these electrons increase the polarization of the ferroelectric layer 644, such that the VTC hysteresis loop is enlarged.

Figure 21B:
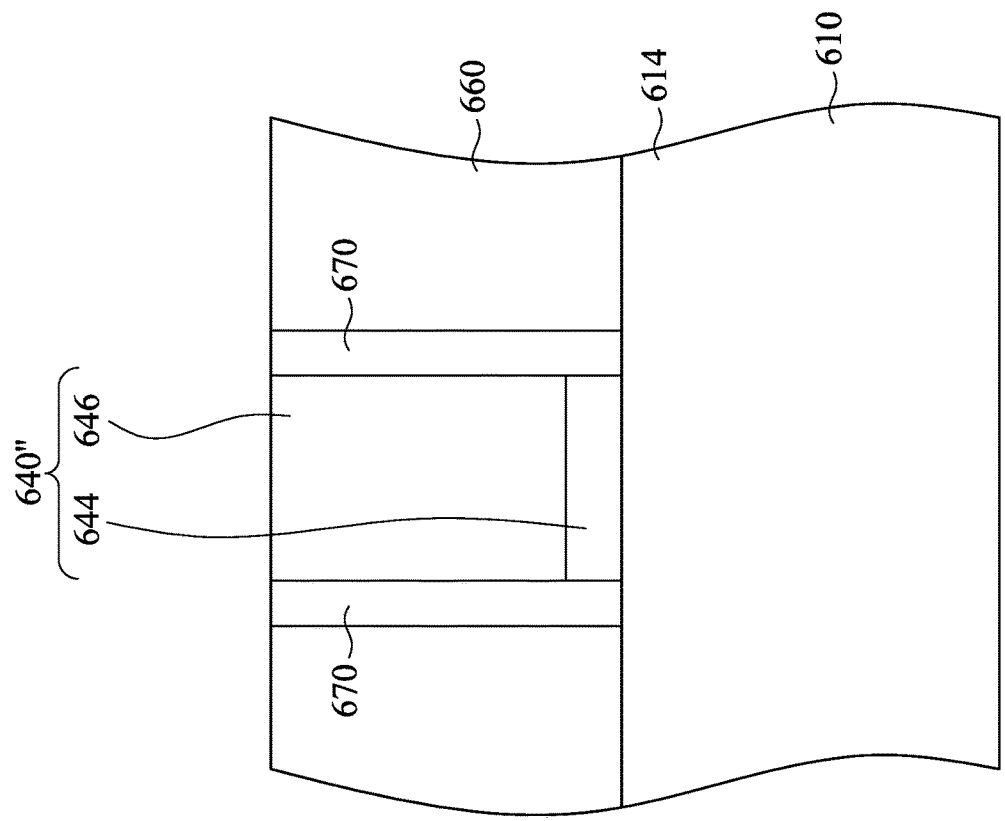
FIGS. 21A and 21B are cross-sectional views of transistors according to some embodiments.
Figure 21A:
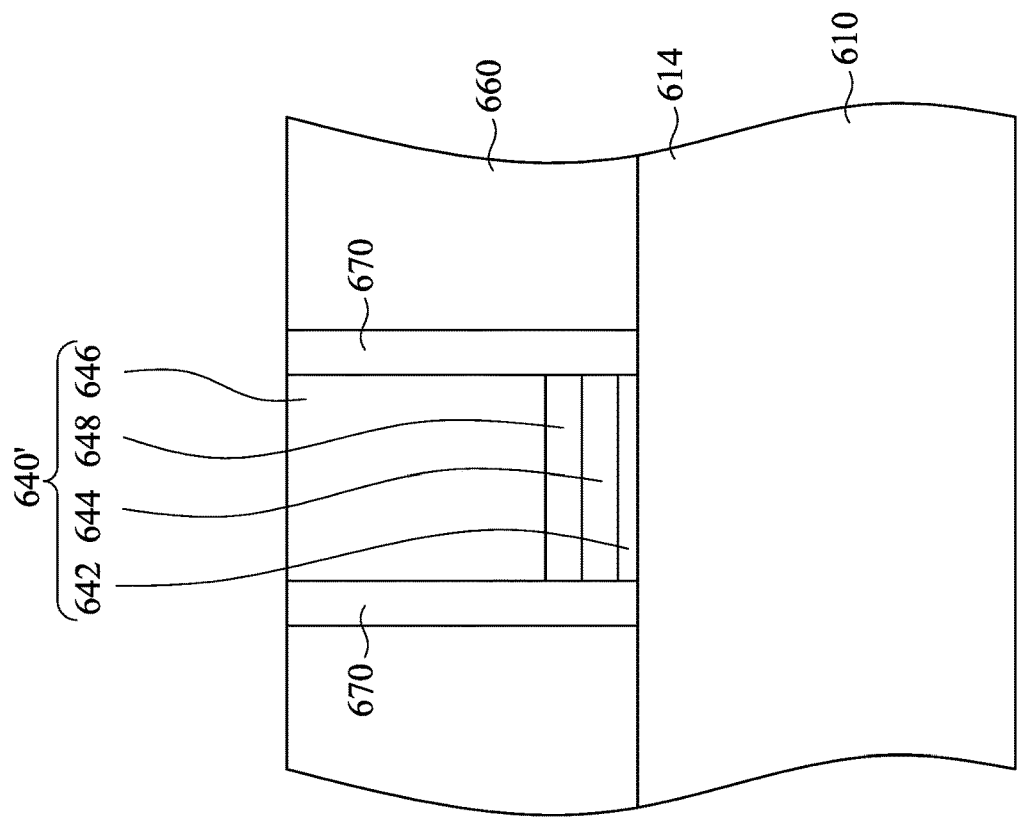

FIGS. 21A and 21B are cross-sectional views of transistors according to some embodiments. In FIG. 21A, gate spacer 670 surrounds the gate structure 640'. That is, the gate spacer 670 is in contact with the interfacial layers 642, the metal layer 648, the ferroelectric layer 644, and the gate electrode 646. In FIG. 21B, gate spacer 670 surrounds the gate structure 640". That is, the gate spacer 670 is in contact with the ferroelectric layer 644 and the gate electrode 646.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the memory circuit has a single inverter to store two states, and thus the layout area of the memory circuit can be reduced. Another advantage is that the aforementioned memory circuits are write disturbing free (and read disturbing free). Furthermore, with the FeFET and/or NCFET, the read access time of the memory circuits can be reduced.

According to some embodiments, a memory circuit includes a memory cell and a source line transistor. The memory cell includes a first transistor, a second transistor, a third transistor, and a fourth transistor. The second transistor and the third transistor form an inverter electrically connected to a drain of the first transistor. The inverter is configured to store two states with different applied voltages. The fourth transistor is electrically connected to a node of the inverter. The source line transistor is electrically connected to the fourth transistor.

According to some embodiments, a memory circuit includes a memory cell, a word line, and a bit line. The memory cell includes a first transistor, a second transistor, a third transistor, and a fourth transistor. The second transistor and the third transistor form an inverter, and gates of both the second and third transistors include ferroelectric materials. The word line is electrically connected to a source of the first transistor. The bit line is electrically connected to a drain of the fourth transistor.

According to some embodiments, a method for manufacturing a memory circuit includes forming a first transistor, a second transistor, a third transistor, and a fourth transistor over a substrate. At least the second and third transistors include ferroelectric materials. An interlayer dielectric (ILD) is formed over the first transistor, the second transistor, the third transistor, and the fourth transistor. A first metal line is formed over the ILD to interconnect drains of the second and third transistors and a gate of the fourth transistor. A second metal line is formed over the ILD to interconnect a drain of the first transistor and gates of the second and third transistors. A write word line is formed over the ILD and electrically connected to a gate of the first transistor. The write word line is electrically isolated from the fourth transistor. A word line is fromed over the ILD and electrically connected to a source of the first transistor. A bit line is formed over the ILD and electrically connected to the fourth transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   a memory cell comprising:
   a first transistor;
   a second transistor;
   a third transistor, wherein the second transistor and the third transistor form an inverter electrically connected to a drain of the first transistor, wherein the second transistor and the third transistor together exhibit a voltage transfer characteristic hysteresis behavior and the inverter is configured to store two states with different applied voltages; and
   a fourth transistor electrically connected to a node of the inverter, wherein a gate of the fourth transistor is electrically isolated from the inverter, and a source of the fourth transistor is connected to a drain of the second transistor and a drain of the third transistor;
   a write word line connected to a gate of the first transistor and that is electrically isolated from the fourth transistor;
   a source line electrically connected to the gate of the fourth transistor; and
   a bit line electrically connected to a drain of the fourth transistor for reading.

2. The memory circuit of claim 1, wherein both the second transistor and the third transistor are ferroelectric field effect transistors (FeFETs).

3. The memory circuit of claim 1, wherein both the second transistor and the third transistor are negative capacitance FETs (NCFETs).

4. The memory circuit of claim 1, wherein the drain of the first transistor is electrically connected to gates of the second transistor and the third transistor.

5. The memory circuit of claim 1, wherein gates of the second and third transistors comprise HfZrO, $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_2$ (BLT), $LaNiO_3$ (LNO), $YMnO_3$, $ZrO_2$, zirconium silicate, ZrAlSiO, $HfO_2$, hafnium silicate, HfAlO, LaAlO, lanthanum oxide, $HfO_2$ doped with Si, $Ta_2O_5$, or combinations thereof.

6. The memory circuit of claim 1, wherein the gate of the fourth transistor is electrically isolated from the gate of the first transistor.

7. The memory circuit of claim 1, further comprising a ground line, wherein a source of the second transistor is connected to the ground line, and the drain of the second transistor is connected to the node of the inverter.

8. The memory circuit of claim 1, further comprising a power line, wherein a source of the third transistor is connected to the power line, and the drain of the third transistor is connected to the node of the inverter.

9. The memory circuit of claim 1, further comprising a word line electrically connected to a source of the first transistor for providing a voltage to the first transistor.

10. The memory circuit of claim 1, further comprising a source line transistor connecting the source line, wherein the source line is substantially perpendicular to the bit line.

11. The memory circuit of claim 1, wherein the memory cell is a four-transistor (4T) memory cell.

12. A memory circuit comprising:
    a memory cell comprising:
    a first transistor;
    a second transistor;
    a third transistor, wherein the second transistor and the third transistor form an inverter, and gates of both the second and third transistors comprise ferroelectric materials; and
    a fourth transistor, wherein the inverter is electrically connected to the first transistor, a source of the fourth transistor is electrically connected to a drain of the second transistor, and a gate of the fourth transistor is electrically isolated from the gates of the second and third transistors;
    a write word line electrically connected to a gate of the first transistor, wherein the write word line is electrically isolated from the fourth transistor;
    a word line electrically connected to a source of the first transistor; and
    a bit line electrically connected to a drain of the fourth transistor.

13. The memory circuit of claim 12, wherein the source of the fourth transistor is further electrically connected to a drain of the third transistor.

14. The memory circuit of claim 12, further comprising a source line electrically connected to the gate of the fourth transistor.

15. The memory circuit of claim 12, wherein the word line is substantially parallel to the bit line.

16. The memory circuit of claim 12, wherein the word line and the bit line are at the same level.

17. The memory circuit of claim 12, further comprising a source line transistor connected to the fourth transistor and electrically isolated from the first transistor.

18. A memory circuit comprising:
    a memory cell comprising:
    a first transistor;
    a second transistor and a third transistor forming an inverter electrically connected to a drain of the first transistor; and
    a fourth transistor, wherein a source of the fourth transistor is connected to a drain of the second transistor and a drain of the third transistor;

a write word line connected to a gate of the first transistor and that is electrically isolated from the fourth transistor;

a bit line connected to a drain of the fourth transistor; and a source line electrically connected to a gate of the fourth transistor.

19. The memory circuit of claim 18, wherein the write word line extends in a direction substantially the same as an extension direction of the source line.

20. The memory circuit of claim 18, wherein the second transistor and the third transistor are negative capacitance FETs (NCFETs).

* * * * *